US012522803B2

(12) United States Patent
Kim et al.

(10) Patent No.: US 12,522,803 B2
(45) Date of Patent: Jan. 13, 2026

(54) METHODS FOR ACTIVATING IMMUNE CELLS

(71) Applicant: TULYNODE BIOSCIENCES INC, San Diego, CA (US)

(72) Inventors: Phillip S. Kim, San Diego, CA (US); Brian E. Grot, San Diego, CA (US); Emma Langley, San Diego, CA (US)

(73) Assignee: TULYNODE BIOSCIENCES INC., San Diego, CA (US)

( * ) Notice: Subject to any disclaimer, the term of this patent is extended or adjusted under 35 U.S.C. 154(b) by 870 days.

(21) Appl. No.: 16/779,042

(22) Filed: Jan. 31, 2020

(65) Prior Publication Data

US 2020/0338174 A1 Oct. 29, 2020

Related U.S. Application Data

(63) Continuation of application No. PCT/US2018/045260, filed on Aug. 3, 2018.

(60) Provisional application No. 62/541,402, filed on Aug. 4, 2017.

(51) Int. Cl.

| | |
|---|---|
| ***C12N 5/078*** | (2010.01) |
| ***A61K 40/10*** | (2025.01) |
| ***A61K 40/11*** | (2025.01) |
| ***A61K 40/31*** | (2025.01) |
| ***A61K 40/42*** | (2025.01) |
| ***C12N 11/00*** | (2006.01) |

(52) U.S. Cl.

CPC ............ *C12N 5/0634* (2013.01); *A61K 40/10* (2025.01); *A61K 40/11* (2025.01); *A61K 40/31* (2025.01); *A61K 40/42* (2025.01); *C12N 11/00* (2013.01); *A61K 2239/54* (2023.05); *C12N 2501/2302* (2013.01); *C12N 2502/30* (2013.01); *C12N 2533/50* (2013.01); *C12N 2539/00* (2013.01)

(58) Field of Classification Search

None

See application file for complete search history.

(56) References Cited

U.S. PATENT DOCUMENTS

| | | | | |
|---|---|---|---|---|
| 2002/0188240 | A1 | 12/2002 | Gorsuch | |
| 2003/0235908 | A1 | 12/2003 | Berenson et al. | |
| 2004/0224402 | A1 | 11/2004 | Bouyhadi et al. | |
| 2007/0027111 | A1 * | 2/2007 | Hawkins ............ | A61K 39/0011 514/102 |
| 2008/0305473 | A1 | 12/2008 | Chowdary et al. | |
| 2009/0047656 | A1 * | 2/2009 | Baden .................. | C12Q 1/6886 435/7.1 |
| 2010/0215628 | A1 | 8/2010 | Liu et al. | |
| 2014/0154799 | A1 * | 6/2014 | Mihalcioiu .......... | C12N 5/0694 435/325 |
| 2016/0075995 | A1 | 3/2016 | Kobielak | |
| 2016/0075996 | A1 * | 3/2016 | Terunuma .......... | C07K 16/2878 435/405 |

FOREIGN PATENT DOCUMENTS

| | | | |
|---|---|---|---|
| JP | 2004-531349 | A | 10/2004 |
| JP | 2006516197 | A | 6/2006 |
| KR | 10-2003-0032922 | A | 4/2003 |
| WO | 01/62895 | A2 | 8/2001 |
| WO | 03/002173 | A1 | 1/2003 |
| WO | 2004/065590 | A2 | 8/2004 |
| WO | 2004/104185 | A1 | 12/2004 |

OTHER PUBLICATIONS

Yu et al (Cytometry, 79A(1009-1015, 2011).*
Tevis et al (Acta Biomater, 50:271-289, 2017).*
Bernier et al (CROH, 108:97-108, 2016).*
Stagg et al (HGT, 15:597-608, 2004).*
Stagg et al (CMM, 13:856-867, 2013).*
Kantoff et al., "Sipuleucel-T Immunotherapy for Castration-Resistant Prostate Cancer", The New England Journal of Medicine, vol. 363, No. 5, Jul. 29, 2010, pp. 411-422.
Matheoud et al., "Dendritic Cells Crosspresent Antigens from Live B 16 Cells More Efficiently than from Apoptotic Cells and Protect from Melanoma in a Therapeutic Model", PLOS ONE, vol. 6, No. 4, e19104, Apr. 28, 2011, 8 pages.
International Application No. PCT/US2018/045260, International Preliminary Report on Patentability, Mailed on Feb. 13, 2020, 8 pages.
International Application No. PCT/US2018/045260, International Search Report and Written Opinion, Mailed on Jan. 30, 2019, 12 pages.
International Application No. PCT/US2018/045260, International Search Report and Written Opinion, Mailed on Nov. 19, 2018, 12 pages.
Powell et al., "Adoptive Transfer of Vaccine-Induced Peripheral Blood Mononuclear Cells to Patients with Metastatic Melanoma Following Lymphodepletion", The Journal of Immunology, vol. 177, No. 9, Nov. 1, 2006, pp. 6527-6539.

* cited by examiner

*Primary Examiner* — Brad Duffy

(74) *Attorney, Agent, or Firm* — Kilpatrick Townsend & Stockton LLP

(57) ABSTRACT

Provided herein are methods for activating an immune cell in a subject. In some embodiments, the methods comprise passing an immune cell from a subject through an immune modulating chamber comprising a tumor cell, thereby activating the immune cell, and returning the activated immune cell to the subject. In some embodiments, the methods further comprise isolating an immune cell-containing portion of a sample and passing the immune cell-containing portion through the immune modulating chamber. Methods of treating cancer and methods of inducing an immune response against a tumor are also provided herein.

60 Claims, 19 Drawing Sheets

① Whole blood from a patient
② Filtered blood (RBC, WBC, Platelets)
③ Plasma
④ Apheresis-Separated blood (WBC)
⑤ Apheresis-Separated blood (Non-WBC/Plasma)
⑥ Immune Modulating Chamber (Captured Tumor Cells)
⑦ Activated Tumor-Targeting Immune Cells

Group 1: Tumor cells only control

METHODS FOR ACTIVATING IMMUNE CELLS

CROSS-REFERENCES TO RELATED APPLICATIONS

The present application is a continuation of PCT/US2018/045260, filed Aug. 3, 2018, which claims priority to U.S. Provisional Application No. 62/541,402, filed Aug. 4, 2017, the disclosures of which are incorporated herein by reference in their entirety for all purposes.

BACKGROUND OF THE INVENTION

Immuno-oncology is a rapidly growing field on the frontier of cancer treatment. Contrary to cancer therapies that directly target malignant cells, immuno-oncology therapies activate the body's immune system to target and attack the tumor. Several immuno-oncology methods have been developed, including immune checkpoint inhibitors, vaccination, enzyme inhibition, in vitro T cell manipulation, induction of tumor cell death, and bispecific T cell engagers.

Checkpoint inhibitors—such as CTLA-4, PD-1, and PDL-1 inhibitors—are typically monoclonal antibodies that block binding of tumor cells to receptors that inactivate T cells. Disruption of this interaction between tumor cells and tumor-specific immune cells prevents immune cell inactivation. Targeting tumor cell and immune cell interactions requires the presence of infiltrating lymphocytes in the tumor microenvironment.

Therapeutic vaccination against cancer induces and/or rescues the immune response against tumor antigens that are either expressed by tumor cells or presented by antigen presenting cells (APCs). This approach is often effective for highly mutagenic tumors with mutated peptides or abnormal post-translational modifications.

Enzyme inhibitors take advantage of the fact that metabolizing certain amino acids has been identified to be critical in the regulation of the immune response to cancer. Indoleamine-pyrrole 2,3-deoxygenase (IDO) has been shown to induce regulatory T cells (Tregs) to suppress the immune response in tumor microenvironment. Thus, IDO inhibition is being explored as an immuno-oncological therapeutic option.

In vitro manipulations of a patient's T cells can be used to directly attack a tumor. Adoptive cell transfer is among the oldest of these methods and involves the removal of T cells from the body, which are then expanded and genetically modified to generate T cells having chimeric antigen receptors (CAR T cells) for specificity toward tumor-associated antigens (TAAs), and then reintroduced into the patient. CAR T cell-based immune-oncology strategies were expected to be highly effective in treating hematological tumors but their effect in dealing with solid tumors has been disappointing.

The induction of tumor cell death by oncolytic viruses, local radiation therapy, or chemotherapy results in cytotoxicity that has the potential to elicit an immune response that furthers tumor cell killing. Bispecific T cell engagers are modified antibodies that act to link a T cell and tumor cell through surface receptors, thereby forcibly generating immune recognition.

The full therapeutic potential of the aforementioned therapies, alone or in combination, has not yet been realized. Of note, while checkpoint inhibitors have produced clinical responses that are remarkable for some cancers, the majority of cancer patients do not respond to the treatment, or duration of response is relatively short. Given that immune-oncology therapies are all still very new and unproven, or have been successful in only a subset of patients, there remains a need in the art for new therapeutic methods that can activate immune cells for the treatment of cancer and other diseases. The present invention satisfies this need, and provides related advantages as well.

BRIEF SUMMARY OF THE INVENTION

In one aspect, the present invention provides a method for activating an immune cell in a subject. In some embodiments, the method comprises:

(a) isolating the immune cell from the subject, (b) passing the isolated immune cell through an immune modulating chamber, wherein the immune modulating chamber comprises a solid support and a tumor cell that is restrained on the solid support within the immune modulating chamber, thereby exposing the isolated immune cell to the tumor cell and activating the immune cell, and (c) returning the activated immune cell to the subject.

In some embodiments, the method is performed ex vivo. In other embodiments, the method increases an autologous immune response in the subject. In some other embodiments, the method reduces or eliminates an adverse effect of a systemic therapy in the subject. In some embodiments, the immune cell is a leukocyte or a peripheral blood mononuclear cell (PBMC).

In some embodiments, the immune modulating chamber further comprises a stromal cell and/or a stromal component that is restrained on the solid support. In other embodiments, the immune cell is contained within a whole blood sample that is obtained from the subject. In particular embodiments, the whole blood sample is passed through the immune modulating chamber.

In some embodiments, an immune cell-containing portion is isolated from the whole blood sample, and the immune cell-containing portion of the whole blood sample is passed through the immune modulating chamber. In some instances, the immune cell-containing portion of the whole blood sample is isolated using a filtration method. In other instances, the immune cell-containing portion of the whole blood sample is isolated using apheresis. In some embodiments, the immune cell-containing portion of the whole blood sample is isolated by passing the whole blood sample through an isolation device that is in fluid communication with the immune modulating chamber. In particular embodiments, an immune inhibition factor and/or a factor that has an adverse effect on the subject are removed from the immune cell-containing portion and/or a non-immune cell-containing portion of the whole blood sample before the immune cell-containing portion and/or the non-immune cell-containing portion of the whole blood sample are returned to the subject.

In some embodiments, the immune modulating chamber further comprises an inlet port and/or an outlet port. In particular embodiments, the inlet and/or the outlet port are in fluid communication with the subject's vascular system, peritoneal cavity, pleural cavity, or cerebrospinal fluid (CSF). In some instances, the inlet and/or outlet port are in fluid communication with the subject's venous system. In other instances, the inlet and/or outlet port are in fluid communication with the subject's arterial system.

In some embodiments, the tumor cell is a circulating tumor cell (CTC). In other embodiments, the tumor cell comprises a tumor cell lysate. In some embodiments, the tumor cell comprises a plurality of tumor cells. In other embodiments, the tumor cell is obtained from a biopsy, a fine needle aspirate (FNA), a surgical resection, a blood sample, a pleural effusion sample, a peritoneal effusion sample, a CSF sample, or a combination thereof In some embodiments, the tumor cell comprises an autologous tumor cell and/or an autologous tumor cell lysate. In particular embodiments, the tumor cell comprises an allogeneic tumor cell and/or an allogeneic tumor cell lysate.

In some embodiments, the tumor cell is introduced into the immune modulating chamber before the immune cell is passed through the immune modulating chamber. In other embodiments, the tumor cell is introduced into the immune modulating chamber concurrently with or after the immune cell is passed through the immune modulating chamber. In particular embodiments, the tumor cell is contained within a whole blood sample or immune cell-containing portion thereof, and becomes restrained on the solid support within the immune modulating chamber as the blood sample or immune cell-containing portion thereof passes through the immune modulating chamber.

In some embodiments, the tumor and/or stromal cell are restrained on the solid support by a capture moiety. In particular embodiments, the capture moiety also promotes tumor and/or stromal cell proliferation. In some embodiments, the capture moiety is selected from the group consisting of an antibody, a cell adhesion molecule, and a combination thereof In some instances, the antibody is an antibody that binds to epithelial cell adhesion molecule (EpCAM), alpha-fetoprotein (AFP), carcinoembryonic antigen (CEA), cancer antigen 125 (CA-125), MUC1, CD44, HER2, HER3, FGFR1, FGFR2, FGFR3, FGFR4, IGF1R, c-Met, EGFR, PD-L1, or a combination thereof In some embodiments, the cell adhesion molecule is selected from the group consisting of a selectin, an integrin, vascular cell adhesion molecule 1 (VCAM1), and a combination thereof In some instances, the selectin is selected from the group consisting of E-selectin, L-selectin, and a combination thereof.

In some embodiments, the immune modulating chamber further comprises a pro-immunogenic factor. In particular embodiments, the pro-immunogenic factor is an immune stimulating factor, an anti-immune inhibition factor, or a combination thereof In some instances, the immune stimulating factor is selected from the group consisting of interleukin 2 (IL-2), interleukin 4 (IL-4), interleukin 5 (IL-5), interleukin 6 (IL-6), interleukin-12 (IL-12), interleukin 17 (IL-17), interleukin 22 (IL-22), C—X—C chemokine receptor type 3 (CXCR3), interferon gamma (INFγ), tumor necrosis factor alpha (TNFα), granulocyte-macrophage colony-stimulating factor (GM-CSF), and a combination thereof. In some embodiments, the immune stimulating factor is IL-2. In some embodiments, the anti-immune inhibition factor is selected from the group consisting of an immune checkpoint inhibitor, an indoleamine 2,3-dioxygnease (IDO) inhibitor, and a combination thereof In some instances, the immune checkpoint inhibitor inhibits programmed cell death 1 ligand 1 (PDL1), programmed cell death protein 1 (PD1), cytotoxic T lymphocyte associated protein 4 (CTLA4), T cell immunoglobulin 3 (TIM3), lymphocyte activation gene 3 (LAG3), V-domain Ig suppressor of T cell activation (VISTA), B and T lymphocyte attenuator (BTLA), or a combination thereof.

In some embodiments, the immune modulating chamber further comprises a subject-specific mutated peptide. In some instances, the subject-specific mutated peptide is selected from the group consisting of EGFRvIII peptide, p95HER2 peptide, an EGFR peptide comprising an activating mutation, and a combination thereof.

In some embodiments, the capture moiety, pro-immunogenic factor, and/or subject-specific mutated peptide are attached to the solid support. In other embodiments, the solid support comprises an interior surface of the immune modulating chamber or a support structure that is in contact with an interior surface of the immune modulating chamber, and optionally further comprises a magnetic composition. In particular embodiments, the support structure comprises a matrix.

In some embodiments, the capture moiety, pro-immunogenic factor, and/or subject-specific mutated peptide are covalently attached to the solid support. In other embodiments, the capture moiety, pro-immunogenic factor, and/or subject-specific mutated peptide are magnetically attached to the solid support. In some embodiments, the capture moiety, pro-immunogenic factor, and/or subject-specific mutated peptide comprise a magnetic particle. In particular embodiments, the solid support comprises a magnetic composition and the capture moiety, pro-immunogenic factor, and/or subject-specific mutated peptide are magnetically attached to the magnetic composition. In other embodiments, an electromagnetic field that is external to the immune modulating chamber is used to magnetically attach the capture moiety, pro-immunogenic factor, and/or subject-specific mutated peptide to the solid support.

In some embodiments, the tumor cell is induced to undergo apoptosis by exposure to an oncolytic virus, radiation, and/or a chemotherapeutic agent. In other embodiments, the subject is administered a chimeric antigen receptor T-cell.

In some embodiments, the immune modulating chamber further comprises a flow regulator. In other embodiments, the immune modulating chamber further comprises a pump. In some embodiments, the flow regulator and/or the pump are used to adjust the rate at which the immune cell passes through the immune modulating chamber. In particular embodiments, the availability of oxygen inside the immune modulating chamber is controlled by using the flow regulator and/or the pump to adjust the flow rate of whole blood through the immune modulating chamber and/or by adjusting the number or density of red blood cells passing through the immune modulating chamber.

In some embodiments, multiple immune modulating chambers are used. In particular embodiments, the multiple immune modulating chambers are each in fluid communication with each other. In some embodiments, each of the multiple immune modulating chambers comprises a different tumor cell. In some embodiments, a first immune modulating chamber is replaced with a second immune modulating chamber. In other embodiments, the tumor cell is removed from the immune modulating chamber after the immune cell has passed through the immune modulating chamber, and the presence or level of one or more biomarkers in the tumor cell is detected. In some instances, the presence or level of the one or more biomarkers is used to provide a diagnosis to the subject and/or select a treatment for a disease in the subject.

In another aspect, the present invention provides a method for treating cancer in a subject. In some embodiments, the method comprises activating an immune cell according to a method of the present invention. In particular embodiments, the cancer comprises a solid tumor. In some embodiments, the cancer is selected from the group consisting of lung cancer, brain cancer, breast cancer, gastric cancer, colorectal cancer, prostate cancer, ovarian cancer, melanoma, a sarcoma, and a combination thereof.

In another aspect, the present invention provides a method for inducing an immune response against a tumor in a subject. In some embodiments, the method comprises activating an immune cell according to a method of the present invention. In some embodiments, the tumor comprises the same type of tumor cell that is restrained on the solid support within the immune modulating chamber. In particular embodiments, the tumor is a solid tumor. In some embodiments, the tumor is from a cancer selected from the group consisting of lung cancer, brain cancer, breast cancer, gastric cancer, colorectal cancer, prostate cancer, ovarian cancer, melanoma, a sarcoma, and a combination thereof.

Other objects, features, and advantages of the present invention will be apparent to one of skill in the art from the following detailed description and figures.

BRIEF DESCRIPTION OF THE DRAWINGS

FIG. 4A depicts the injection of tumor cells, stromal cells, and/or stromal components into the immune modulating chamber, where they become restrained within the support structure. Cells obtained from a lymph node (e.g., immune cells obtained from a lymph node of a subject) can also be injected into the immune modulating chamber and become restrained within the support structure. FIG. 4B depicts that blood flowing into the immune modulating chamber is contacted with the support structure before flowing out of the chamber. Optionally, the immune modulating chamber can comprise or be located upon an electromagnetic pad. The support structure is useful for, among other things, autologous immune cell therapy, as well as comprehensive real-time profiling of evolving disease (e.g., for clinical oncology). As non-limiting examples, the support structure enables real-time tumor cell capture, continuous tumor cell profiling, immune cell profiling, and tumor-specific immune cell activation.

FIG. 16A shows bright field (left) and fluorescent (right) images of a Group 1 mouse. Arrows point to visible tumors present in the peritoneal cavity of the mouse harboring GFP-pancreatic tumor model. Fluorescent tumor cells were visible throughout the visceral space along the intestinal lining (encircled by dashed line). FIG. 16B shows images of suspicious tumor samples that were harvested (left) along with omentum (right). FIG. 16C shows cytometric analysis of cells present in the suspicious tumor sample (left) and omentum (middle), as well as PBMCs collected from this mouse (right). FIG. 16D shows bright field (left) and fluorescent (right) images of a Group 2 mouse. No visible tumors were present in the peritoneal cavity of the mouse injected with Pan02-H2bGFP cells. No evidence of GFP-tumor cells was observed with fluorescent scanning. FIG. 16E shows images of suspicious tumor samples that were harvested (left) along with omentum (right). FIG. 16F shows cytometric analysis of cells present in the suspicious tumor sample (left) and omentum (middle), as well as PBMCs collected from this mouse (right). FIG. 16G shows bright field (left) and fluorescent (right) images of a Group 3 mouse. Arrow points to visible tumor present in the peritoneal cavity of the mouse harboring GFP-pancreatic tumor model. Fluorescent tumor cells were visible throughout the visceral space along the intestinal lining (encircled by dashed line). This mouse died prior to the examination and no further cytometric analysis was performed.

DETAILED DESCRIPTION OF THE INVENTION

I. INTRODUCTION

Figure 1:
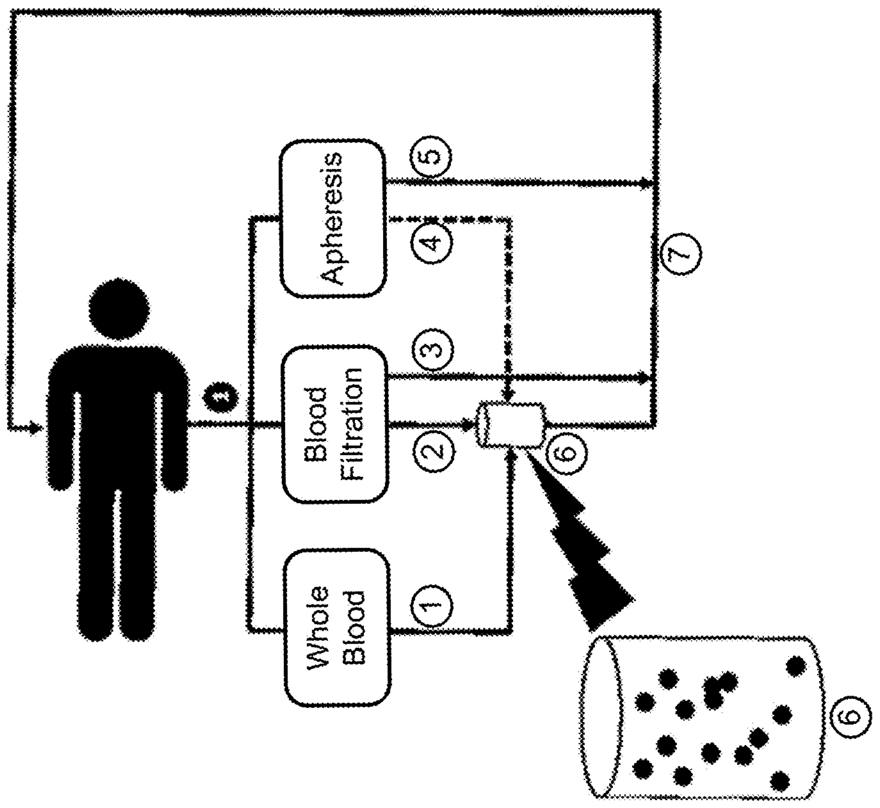
FIG. 1 shows a schematic of certain embodiments of the present invention. In one embodiment, whole blood is obtained from the subject, passed through the immune modulating chamber, and returned to the subject. In a second embodiment, whole blood is obtained from the subject and filtered, and the immune cell-containing portion is passed through the immune modulating chamber. The immune cell-containing portion and/or the non-immune cell containing portion are returned to the subject. When both the immune cell-containing portion and the non-immune cell-containing portion are returned to the subject, they can be returned independently, or combined and returned to the subject. In a third embodiment, whole blood is obtained from the subject and undergoes apheresis, and the immune cell-containing portion is passed through the immune modulating chamber. The immune cell-containing portion and/or the non-immune cell containing portion are returned to the subject. When both the immune cell-containing portion and the non-immune cell-containing portion are returned to the subject, they can be returned independently, or combined and returned to the subject.

The present invention is based, in part, on the development of a method capable of regulating immune pathways to restore well-balanced immunostasis in subjects suffering from diseases caused by dysregulated immune function, thus addressing unmet clinical needs in oncology and other areas of medicine. According to the methods of the present invention, an immune cell (e.g., present in a blood sample) is obtained (e.g., isolated) from a subject (e.g., a patient), is passed through an immune modulating chamber, whereby it becomes activated, and is subsequently returned to the subject. The immune modulating chamber is capable of hosting diseased cells (e.g., tumor cells, stromal cells), tissues, or cellular materials that the immune cell is exposed to as it passes through the immune modulating chamber, thus activating the immune cell. Optionally, the methods of the present invention further comprise isolating a portion of a sample (e.g., a whole blood sample) by treating the sample with an apheresis method or a filtration method, and then the immune cell-containing portion of the sample is passed through the immune modulating chamber (FIG. 1). Isolation of the immune cell-containing portion can be performed, for example, in an isolation device that is connected to the immune modulating chamber and/or the subject.

In some embodiments, the immune modulating chamber mimics a lymph node where tumor-specific immune cell activation takes place prior to recirculating activated immune cells (e.g., leukocytes) back into a subject (e.g., a cancer patient) intravenously. This method's novel approach to treating cancer patients by ex vivo activation of tumor-specific immune cells is advantageous in that it is able to maximize the tumor-specific autologous immune response in a patient, while at the same time minimizing adverse effects that are often observed with systemic treatment. Enriching populations of immune cells and maximizing the tumor-specific immune response is particularly important, as the vast majority of immune cells are not tumor-specific.

In some embodiments, the immune modulating chamber also mimics the tumor microenvironment, as isolated tumor cells are restrained within the immune modulating chamber. A particular advantage of the present invention is that immune cells often do not have access to tumor cells because of stromal barriers, but these barriers are removed within the immune modulating chamber. The restrained tumor cells are inhibited from circulating back into the subject's circulation, but activated immune cells (e.g., leukocytes) may circulate back into the subject for systemic treatment effects. Pro-immunogenic factors may augment the local environment within the immune modulating chamber to enhance a tumor-specific immune response and/or reverse inhibitory effects on immune-suppressed tumor-specific immune cells.

Figure 2:
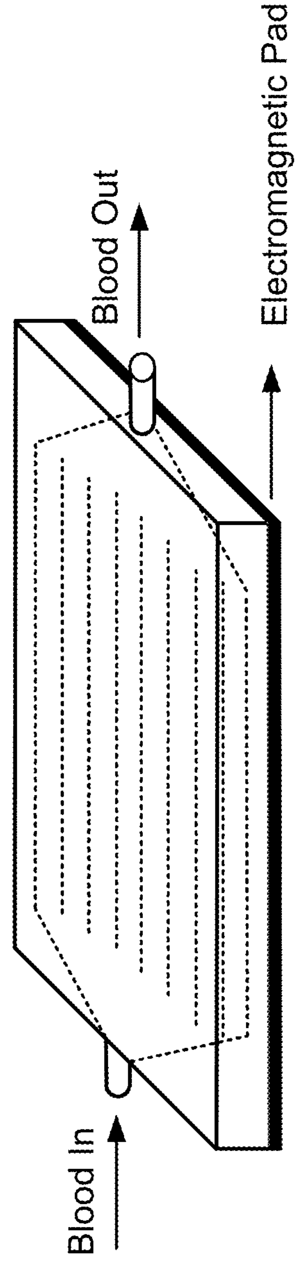
FIG. 2 shows an external view of an immune modulating chamber. In the depicted embodiments, blood enters the immune modulating chamber through an inlet port, passes through the chamber, and exits through an outlet port. An electromagnetic pad is used to generate a magnetic field to attach capture moieties to the solid support or to restrain tumor cells or other components within the immune modulating chamber.
Figure 3:
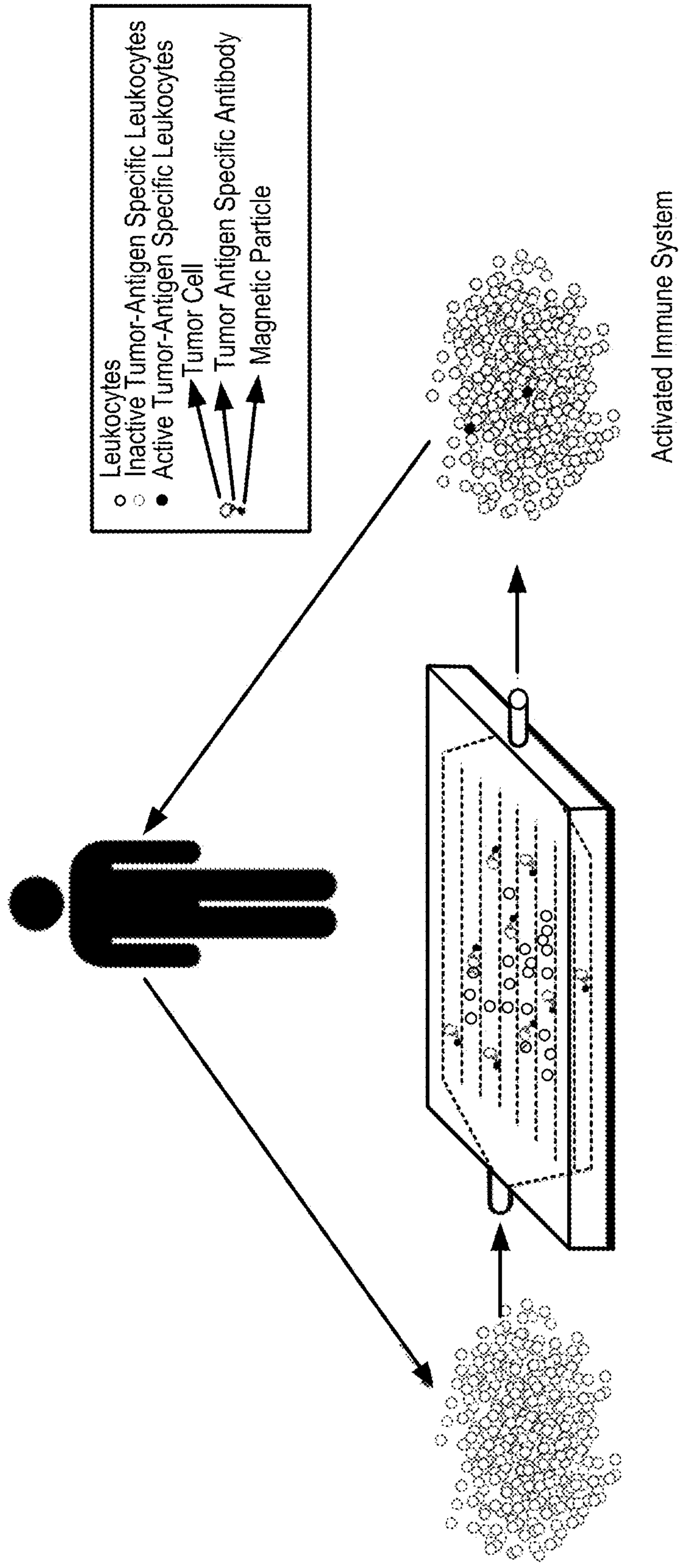
FIG. 3 depicts the activation of tumor-targeting immune cells according to the methods of the present invention. Leukocytes, are isolated from a subject and passed through an immune modulating chamber, where the leukocytes are exposed to tumor cells that are restrained by a capture moiety comprising a tumor antigen-specific antibody and a magnetic particle. As the leukocytes pass through the immune modulating chamber, some of the tumor antigen-specific leukocytes become activated. Both activated and non-activated tumor antigen-specific leukocytes are returned to the subject.
Figure 4A:
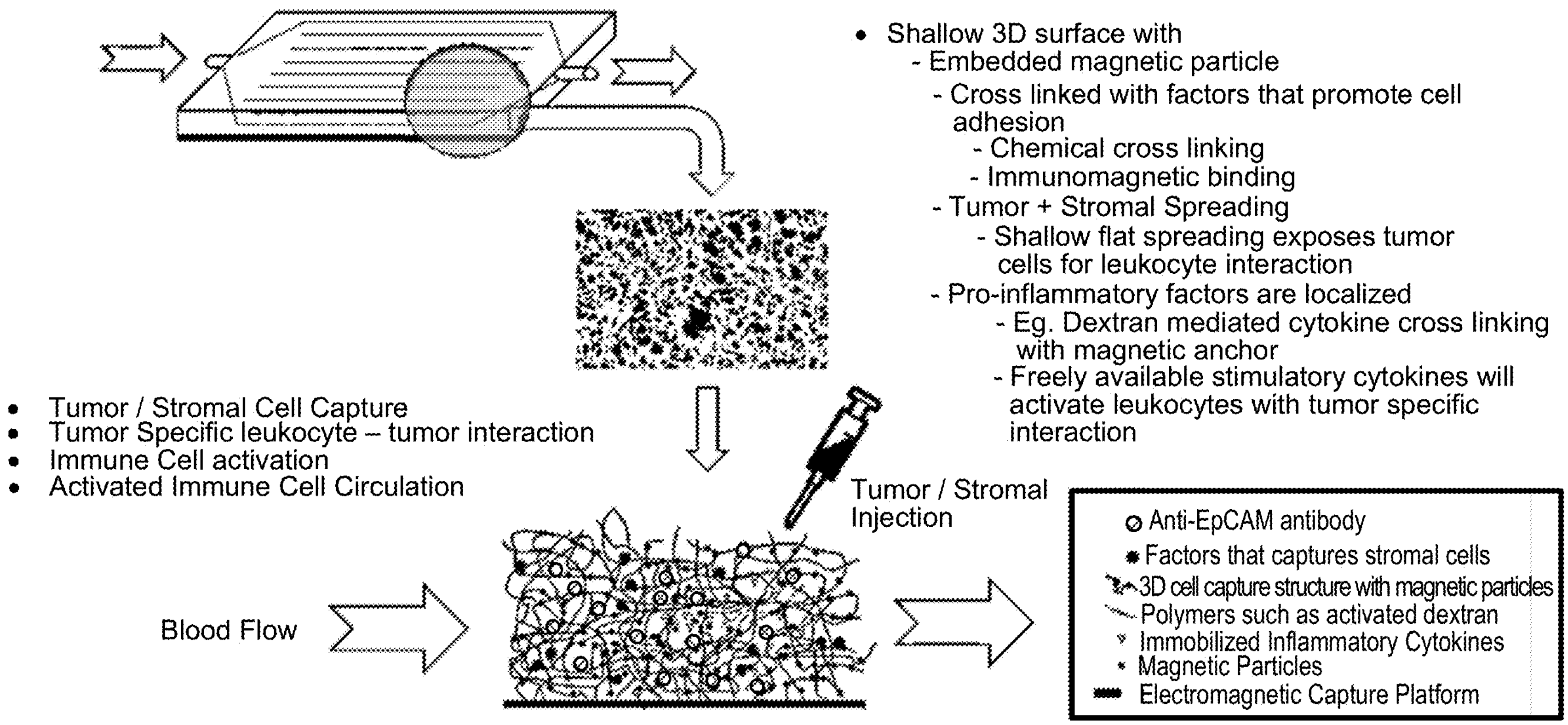
FIGS. 4A and 4B depict immune modulating chambers that can be used in methods of the present invention. The figures depict a support structure (e.g., comprising a matrix) located within the immune modulating chamber.
Figure 4B:
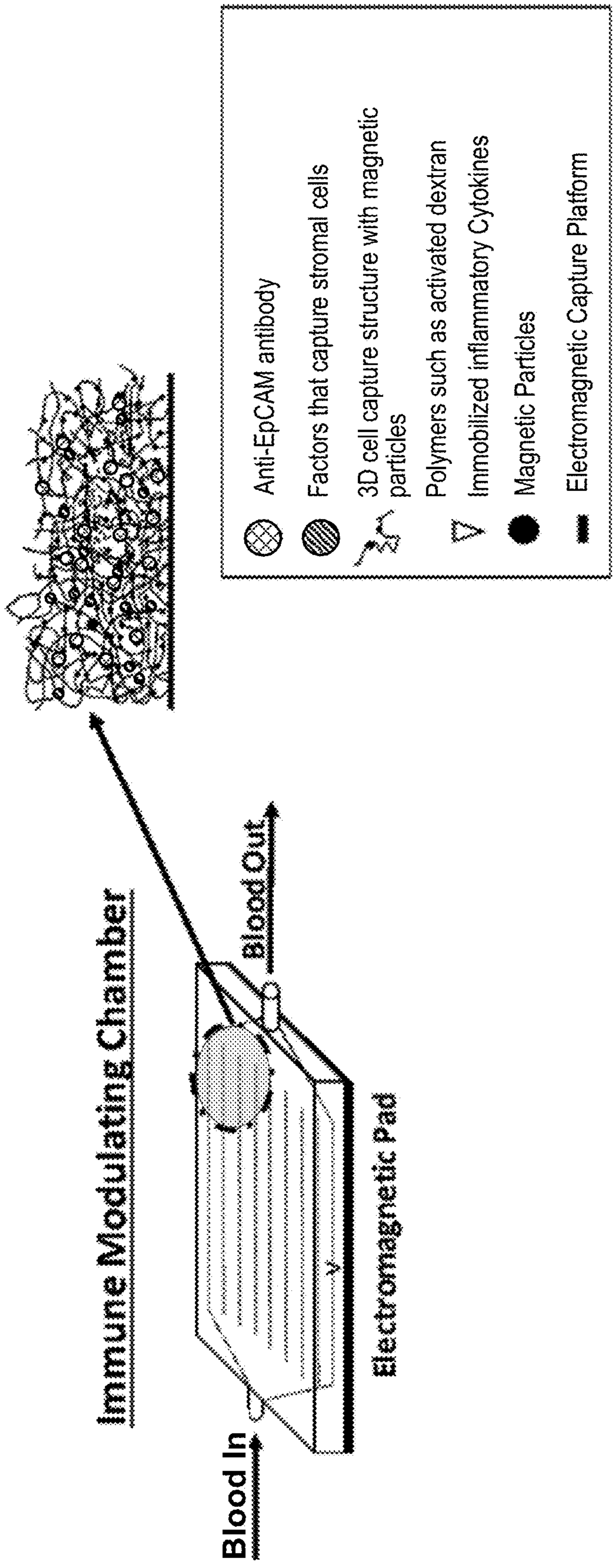

According to methods of the present invention, tumor cells are either captured within the immune modulating chamber (e.g., by immuno-magnetic enrichment of circulating tumor cells) or are introduced into the immune modulating chamber (e.g., by injection of tumor cells or tumor cell-containing specimens such as fine needle aspirates, core biopsy specimens, plural or peritoneal effusion samples). The immune modulating chamber may provide shallow depth three-dimensional structure (such as an agarose gel or Matrigel) that can also include magnetic particles and/or be decorated with capture antibodies that are specific for tumor cells (e.g., anti-EpCAM antibodies) or with cell adhesive factors that promote specific immune cell-tumor cell interaction (FIGS. 2-4) Immobilized stimulatory cytokines can also be present within the immune modulating chamber, providing for efficient tumor antigen-specific immune cell (i.e., leukocyte) activation. This approach provides the advantage that the effects of stimulatory cytokines can be restricted to the intended target (i.e., immune cells) while avoiding adverse effects that occur when such agents are introduced into a subject systemically.

The present invention can be used for therapeutic and/or diagnostic applications. For therapeutic applications, immune modulation chambers can be used in methods of the present invention, e.g., to capture tumor and/or stromal cell contents, as well as facilitate cancer-specific immune cell activation. For diagnostic applications, immune modulation chambers can be used in methods of the present invention, e.g., to continuously capture circulating tumor cells (CTCs), as well as facilitate real-time observations of tumor responses, which in turn allows for real-time treatment feedback, dose-optimization, and/or treatment adjustment.

II. DEFINITIONS

As used herein, the following terms have the meanings ascribed to them unless specified otherwise.

The terms “a,” “an,” or “the” as used herein not only include aspects with one member, but also include aspects with more than one member. For instance, the singular forms “a,” “an,” and “the” include plural referents unless the context clearly dictates otherwise. Thus, for example, reference to “a cell” includes a plurality of such cells and reference to “the agent” includes reference to one or more agents known to those skilled in the art, and so forth.

The terms “about” and “approximately” as used herein shall generally mean an acceptable degree of error for the quantity measured given the nature or precision of the measurements. Typical, exemplary degrees of error are within 20 percent (%), preferably within 10%, and more preferably within 5% of a given value or range of values. Any reference to “about X” specifically indicates at least the values X, 0.95X, 0.96X, 0.97X, 0.98X, 0.99X, 1.01X, 1.02X, 1.03X, 1.04X, and 1.05X. Thus, “about X” is intended to teach and provide written description support for a claim limitation of, e.g., “0.98X.”

The term “activating an immune cell” refers to inducing, triggering, or enhancing one or more biological pathways and/or functions within an immune cell, such that the ability of the immune cell to recognize an antigen (e.g., tumor antigen) or mount a direct or indirect response against an antigen is increased. In some embodiments, immune cell activation induces an immune response in a subject (e.g., against a tumor).

The term “immune response” refers to any response that is induced, triggered, or enhanced in a subject by an antigen (e.g., tumor cell antigen). The term includes the development, maturation, differentiation, and activation of immune cells (e.g., B cells and T cells), as well as the production of antibodies against an antigen. The term also includes increasing or decreasing the expression or activity of cytokines that are involved in regulating immune function.

The terms “subject,” “individual,” and “patient” are used interchangeably herein to refer to a vertebrate, preferably a mammal, more preferably a human. Mammals include, but are not limited to, rodents (e.g., mice, rats), simians, humans, farm animals, sport animals, and pets.

The term “cancer” is intended to include any member of a class of diseases characterized by the uncontrolled growth of aberrant cells. The term includes all known cancers and neoplastic conditions, whether characterized as malignant benign, recurrent, soft tissue, or solid, and cancers of all stages and grades including advanced, pre- and post-metastatic cancers. Non-limiting examples of cancers suitable for treatment according to methods of the present invention are described herein.

In the context of cancer, the term “stage” refers to a classification of the extent of cancer. Factors that are considered when staging a cancer include but are not limited to tumor size, tumor invasion of nearby tissues, and whether the tumor has metastasized to other sites. The specific criteria and parameters for differentiating one stage from another can vary depending on the type of cancer. Cancer staging is used, for example, to assist in determining a prognosis and/or identifying the most appropriate treatment option(s).

One non-limiting example of a cancer staging system is referred to as the “TNM” system. In the TNM system, “T” refers to the size and extent of the main tumor, “N” refers to the number of nearby lymph nodes to which the cancer has spread, and “M” refers to whether the cancer has metastasized. “TX” denotes that the main tumor cannot be measured, “T0” denotes that the main tumor cannot be found, and “T1,” “T2,” “T3,” and “T4” denote the size and/or extent of the main tumor, wherein a larger number corresponds to a larger tumor and/or a tumor that has grown into nearby tissues. “NX” denotes that cancer in nearby lymph nodes cannot be measured, “N0” denotes that there is no cancer in nearby lymph nodes, and “N1,” “N2,” “N3,” and “N4” denote the number and location of lymph nodes to which the cancer has spread, wherein a larger number corresponds to a greater number of lymph nodes containing the cancer. “MX” denotes that metastasis cannot be measured, “M0” denotes that no metastasis has occurred, and “M1” denotes that the cancer has metastasized to other parts of the body.

In another non-limiting example of a cancer staging system, cancers are classified or graded as having one of five stages: “Stage 0,” “Stage I,” “Stage II,” “Stage III,” and “Stage IV.” Stage 0 denotes that abnormal cells are present, but have not spread to nearby tissue. This is also commonly called carcinoma in situ (CIS). CIS is not cancer, but may subsequently develop into cancer. Stages I, II, and III denote that cancer is present. Higher numbers correspond to larger tumor sizes and/or tumors that have spread to nearby tissues. Stage IV denotes that the cancer has metastasized. One of skill in the art will be familiar with different cancer staging systems and readily be able to apply and/or interpret them.

The term “biopsy” refers to the process of removing a tissue sample for diagnostic or prognostic evaluation, and to the tissue specimen itself. Any biopsy technique known in the art can be applied to the methods and compositions of the present invention. The biopsy technique applied will generally depend on the tissue type to be evaluated and the size and type of the tumor (i.e., solid or suspended (i.e., blood, thoracentesis aspirate, or ascites)), among other factors. Representative biopsy techniques include excisional biopsy, incisional biopsy, needle biopsy (e.g., core needle biopsy, fine-needle aspiration biopsy, etc.), surgical biopsy, and bone marrow biopsy. Biopsy techniques are discussed, for example, in *Harrison's Principles of Internal Medicine,* Kasper, et al., eds., 16th ed., 2005, Chapter 70, and throughout Part V. One skilled in the art will appreciate that biopsy techniques can be performed to identify cancerous and/or precancerous cells in a given tissue sample.

The term "treating" refers to an approach for obtaining beneficial or desired results including, but not limited to, a therapeutic benefit and/or a prophylactic benefit. By therapeutic benefit is meant any therapeutically relevant improvement in or effect on one or more diseases, conditions, or symptoms under treatment. Therapeutic benefit can also mean to effect a cure of one or more diseases, conditions, or symptoms under treatment.

The term "vaccine" refers to a biological composition that, when administered to a subject, has the ability to produce an acquired immunity to a particular pathogen or disease in the subject. Typically, one or more antigens, or fragments of antigens, that are associated with the pathogen or disease of interest are administered to the subject. Vaccines can comprise, for example, inactivated or attenuated organisms (e.g., bacteria or viruses), cells, proteins that are expressed from or on cells (e.g., cell surface proteins), proteins that are produced by organisms (e.g., toxins), or portions of organisms (e.g., viral envelope proteins. In some instances, cells are engineered to express proteins such that, when administered as a vaccine, they enhance the ability of a subject to acquire immunity to that particular cell type (e.g., enhance the ability of a subject to acquire immunity to a cancer cell).

The term "survival" refers to a length of time following the diagnosis of a disease and/or beginning or completing a particular course of therapy for a disease (e.g., cancer). The term "overall survival" includes the clinical endpoint describing patients who are alive for a defined period of time after being diagnosed with or treated for a disease, such as cancer. The term "disease-free survival" includes the length of time after treatment for a specific disease (e.g., cancer) during which a patient survives with no sign of the disease (e.g., without known recurrence). In certain embodiments, disease-free survival is a clinical parameter used to evaluate the efficacy of a particular therapy, which is usually measured in units of 1 or 5 years. The term "progression-free survival" includes the length of time during and after treatment for a specific disease (e.g., cancer) in which a patient is living with the disease without additional symptoms of the disease. In some embodiments, survival is expressed as a median or mean value.

The term "peripheral blood mononuclear cell (PBMC)" refers to any peripheral blood having a round nucleus. PBMCs include lymphocytes (e.g., T lymphocytes, B lymphocytes, NK cells) and monocytes. PBMCs can be extracted from whole blood, for example, by using the polysaccharide Ficoll, followed by gradient centrifugation. Following centrifugation, PBMCs are found between the top layer of plasma and the bottom fraction of polymorphonuclear cells and erythrocytes.

The term "lymphocyte" refers to a subtype of white blood cells that includes T lymphocytes (also called "T cells"), B lymphocytes (also called "B cells"), dendritic cells, and natural killer (NK) cells.

T lymphocytes mature in the thymus and play a central role in cell-mediated immunity. T lymphocytes are distinguished from other types of lymphocytes by the presence of T-cell receptors that are present on the cell surface. T lymphocytes are subdivided into several types, including effector T cells, helper T cells, cytotoxic (killer) T cells, memory cells, regulatory (suppressor) T cells, and natural killer T cells. Effector T cells refer to a broad category that includes several T lymphocyte types (including helper, killer, and regulatory cells), and generally are cells that respond to a stimulus. Helper T cells, also known as $CD4^+$ T cells, assist other types of white blood cells, playing roles such as assisting with the maturation of B cells into plasma and memory B cells, and activation of cytotoxic T cells and macrophages. Helper T cells are activated by the presentation of an antigen on the surface of an antigen-presenting cell (APC). Cytotoxic (killer) T cells, also known as $CD8^+$ T cells, destroy virus-infected cells and tumor cells, and are associated with transplant rejection. Memory T cells recognize foreign invaders such as bacteria and viruses, and also tumor cells. After memory T cells encounter and respond to their cognate antigen, upon a second encounter, these cells are able to reproduce and mount a stronger and fast immune response. Regulatory (suppressor) T cells (Tregs) are critical for maintaining immunological tolerance; their major role is to downregulate T lymphocyte-mediated immunity near the end of an immune reaction and to inhibit autoreactive T lymphocytes that escaped the process of negative selection in the thymus. Natural killer T cells, which bridge the adaptive and innate immune systems, recognize an antigen presented by CD1d molecules and perform functions such as cytokine production and the release of cytolytic molecules.

B lymphocytes secrete antibodies and function in the humoral immunity component of the adaptive immune system. In addition, B lymphocytes can function as antigen-presenting cells and secrete cytokines. B lymphocytes, which mature in the bone marrow, are distinguished from other types of lymphocytes by the presence of B cell receptors on the cell surface. Activation of B lymphocytes can either be T lymphocyte-dependent or T lymphocyte-independent. B lymphocytes are subdivided into several types, including plasmablast cells, plasma cells, lymphoplasmacytoid cells, memory B cells, follicular B cells, marginal zone B cells, B-1 cells, B-2 cells, and regulatory B (Breg) cells.

NK cells, which are part of the innate immune system, play major roles in defending against tumor cells and virally infected cells, differentiating these cells from normal cells by recognizing cell surface changes in major histocompatibility complex class I molecules. NK cells are activated by the interferon family of cytokines, and once activated release cytotoxic molecules that destroy the altered or infected cells.

"Interleukins" are a group of cytokines that play important roles in innate and adaptive immune system function. Some interleukins promote the development and differentiation of B lymphocytes, T lymphocytes, and hematopoietic cells. Many interleukins are produced by helper CD4 T lymphocytes, monocytes, macrophages, and endothelial cells. Interleukins can either enhance or inhibit immune function, depending on the particular interleukin.

Non-limiting examples of interleukins (ILs) that can be used in methods of the present invention include IL-2 (which targets activated T cells and B cells, NK cells, macrophages, and oligodendrocytes), IL-4 (which targets activated B cells, T cells, and endothelial cells), IL-5 (which targets B cells and eosinophils), IL-6 (which targets activated B cells, plasma cells, hematopoietic cells, and T cells, among others), IL-12 (which targets activated T cells and NK cells), IL-17 (which targets epithelial and endothelial cells, among others), and IL-22.

"Interleukin 2" or "IL-2" binds to IL-2 receptors (e.g., expressed by lymphocytes) and regulates the activity of white blood cells (e.g., leukocytes, lymphocytes), plays important roles in self versus non-self immune recognition, and participates in responses against microbial infectious agents. IL-2 promotes the differentiation of T cells into effector T cells and memory T cells, and also promotes the differentiation of immature T cells into regulatory T cells. In the context of cancer therapy, IL-2 can increase immune cell activation and subsequent immune cell-mediated inhibition of tumor cell growth. A non-limiting example of a human IL-2 amino acid sequence is set forth under NCBI Reference Sequence number NP_000577.

"Interleukin 4" or "IL-4" induces differentiation of native helper T cells (Th0 cells) to Th2 cells. Subsequently, upon activation by IL-4, Th2 cells produce additional IL-4 in a positive feedback loop. IL-4 also functions to stimulate proliferation of activated B and T cells, differentiation of B cells into plasma cells, induction of B cell class switching to IgE, and upregulation of MHC class II production. IL-4 also decreases the production of Th1 cells, macrophages, interferon-gamma, and dendritic cell IL-12. Non-limiting examples of human IL-4 amino acid sequences are set forth under NCBI Reference Sequence numbers NP_000580, NP_758858, and NP_001341919.

"Interleukin 5" or "IL-5" is produced by Th2 cells and mast cells, and functions to stimulate B cell growth and increase immunoglobulin secretion. A non-limiting example of a human IL-5 amino acid sequence is set forth under NCBI Reference Sequence number NP_000870.

"Interleukin 6" or "IL-6" is produced by macrophages, Th2 cells, B cells, astrocytes, and endothelial cells. IL-6 can act as a pro-inflammatory cytokine. Non-limiting examples of human IL-6 amino acid sequences are set forth under NCBI Reference Sequence numbers NP_000591 and NP_001305024.

The term "tumor necrosis factor-alpha" or "TNFα" refers to the cytokine that is encoded by the TNFA gene in humans. TNFα is produced by activated macrophages, $CD4^+$ T cells, NK cells, neutrophils, eosinophils, mast cells, and neurons. TNFα is involved in processes such as the induction of apoptosis and inflammation, as well as the inhibition of tumorigenesis and viral replication. A non-limiting example of a human TNFα amino acid sequence is set forth under NCBI Reference Sequence number NP_000585.

The term "interferon-gamma" or "IFNγ" refers to a cytokine that is a member of the type II class of interferons and is encoded by the IFNG gene. IFNγ plays important roles in innate and adaptive immunity. In particular, IFNγ activates macrophages and induces expression of class II MHC molecules. IFNγ is produced by natural killer cells, natural killer T cells, $CD4^+$ Th1 cells, $CD8^+$ cytotoxic T lymphocyte cells, and non-cytotoxic innate lymphoid cells. A non-limiting example of a human IFN-γ amino acid sequence is set forth under NCBI Reference Sequence number NP_000610.

III. DESCRIPTION OF THE EMBODIMENTS

In one aspect, the present invention provides a method for activating an immune cell in a subject. In some embodiments, the method comprises: (a) passing an immune cell from the subject through an immune modulating chamber, wherein the immune modulating chamber comprises a solid support and a tumor cell that is restrained on the solid support within the immune modulating chamber, thereby exposing the immune cell to the tumor cell and activating the immune cell, and (b) returning the activated immune cell to the subject. In some embodiments, the immune cell is isolated from the subject (e.g., before the immune cell is passed through the immune modulating chamber).

In some embodiments, the method is performed ex vivo. In other embodiments, the method increases an autologous immune response in the subject. In some other embodiments, the method reduces or eliminates an adverse effect of a systemic therapy in the subject. In some embodiments, the immune cell that is activated is of one cell type. In other instances, the immune cell that is activated is of multiple cell types. In some embodiments, the immune cell that is activated is selected from the group consisting of a leukocyte, a peripheral blood mononuclear cell (PBMC), a lymphocyte (e.g. T lymphocyte, B lymphocyte, dendritic cell, NK cell), a monocyte, a dendritic cell, a macrophage, and a combination thereof In particular embodiments, activation of the immune cell is measured by detecting the presence or level of a biomarker.

In some embodiments, the immune modulating chamber further comprises a stromal cell and/or a stromal component that is restrained on the solid support. In other embodiments, the immune cell is contained within a whole blood sample that is obtained from the subject. In particular embodiments, the whole blood sample is passed through the immune modulating chamber.

In some embodiments, the immune modulating chamber further comprises an inlet port and/or an outlet port. In particular embodiments, the inlet and/or the outlet port are in fluid communication with the subject's vascular system, peritoneal cavity, pleural cavity, or cerebrospinal fluid (CSF). In some instances, the inlet and/or outlet port are in fluid communication with the subject's venous system. In other instances, the inlet and/or outlet port are in fluid communication with the subject's arterial system. In particular embodiments, the immune modulating chamber is connected to (e.g., placed in fluid communication with) the subject's vascular system via an arteriovenous shunt that is placed in the subject.

In some embodiments, an immune cell-containing portion is isolated from the whole blood sample, and the immune cell-containing portion of the whole blood sample is passed through the immune modulating chamber. In some instances, the immune cell-containing portion of the whole blood sample is isolated using a filtration method. In other instances, the immune cell-containing portion of the whole blood sample is isolated using apheresis (e.g., leukapheresis). In some embodiments, the immune cell-containing portion of the whole blood sample is isolated by passing the whole blood sample through an isolation device that is in fluid communication with the immune modulating chamber. In particular embodiments, the isolation device is connected to (e.g., in fluid communication with) both the subject and the immune modulating chamber, and the isolation device is located between the subject and the immune modulating chamber (e.g., the isolation device is connected to an inlet port of the immune modulating chamber). In other embodiments, a filtration device is connected to an outlet port of the immune modulating chamber. In yet other embodiments, a filtration device is connected to both an inlet port and an outlet port of the immune modulating chamber. In some embodiments, the non-immune cell-containing portion of the whole blood sample (e.g., plasma, RBC, platelets) is returned to the subject.

In some embodiments, an immune modulating chamber comprises an immune cell that has been isolated from a lymph node (e.g., a lymph node from the subject) and subsequently introduced into the immune modulating chamber.

In particular embodiments, an immune inhibition factor and/or a factor that has an adverse effect on the subject are removed from the immune cell-containing portion and/or a non-immune cell-containing portion of the whole blood sample before the immune cell-containing portion and/or the non-immune cell-containing portion of the whole blood sample are returned to the subject. As a non-limiting example, anti-inflammatory factors (e.g., IL4, IL10, IL13) can be removed from blood plasma before plasma is returned to the subject. As another non-limiting example, Tregs (e.g., $CD25^+$ cells) can be removed and sequestered (e.g., in a chamber separate from the immune modulating chamber) from a blood sample or a portion thereof before the blood sample or portion thereof is returned to the subject.

In some embodiments, the tumor cell is a circulating tumor cell (CTC). In other embodiments, the tumor cell comprises a tumor cell lysate. In some embodiments, the tumor cell comprises a plurality of tumor cells.

In some embodiments, the tumor cell and/or stromal material (e.g., stromal cell, stromal components) is obtained from the subject as a sample. The sample can be any biological specimen obtained from a patient. Samples include, without limitation, whole blood, plasma, serum, red blood cells, white blood cells (e.g., peripheral blood mononuclear cells), ductal lavage fluid, ascites, pleural efflux, nipple aspirate, lymph (e.g., disseminated tumor cells of the lymph node), bone marrow aspirate, saliva, urine, stool (i.e., feces), sputum, bronchial lavage fluid, tears, fine needle aspirate (e.g., harvested by random periareolar fine needle aspiration), any other bodily fluid, a tissue sample (e.g., tumor tissue) such as a biopsy of a tumor (e.g., needle biopsy) or a lymph node (e.g., sentinel lymph node biopsy), a tissue sample (e.g., tumor tissue) such as a surgical resection of a tumor, and cellular extracts thereof In particular embodiments, the (e.g., when the sample comprises a stool or fecal sample), the sample is treated (e.g., sterilized or disinfected) to reduce or eliminate microbial contamination. In some embodiments, the sample is whole blood or a fractional component thereof such as plasma, serum, or a cell pellet. In other embodiments, the sample is obtained by isolating circulating cells of a solid tumor from whole blood or a cellular fraction thereof using any technique known in the art. In particular embodiments, the sample is a tumor lysate or extract prepared from frozen tissue. In particular embodiments, the tumor cell is obtained from a biopsy, a fine needle aspirate (FNA), a surgical resection, a blood sample, a pleural effusion sample, a peritoneal effusion sample, a CSF sample, or a combination thereof In some embodiments, the tumor cell comprises an autologous tumor cell and/or an autologous tumor cell lysate. In yet other embodiments, the tumor cell comprises an allogeneic tumor cell and/or an allogeneic tumor cell lysate.

In some embodiments, the tumor cell is introduced into the immune modulating chamber before the immune cell is passed through the immune modulating chamber. As non-limiting examples, the tumor cell can be introduced into the immune modulating chamber about 0, 1, 2, 3, 4, 5, 6, 7, 8, 9, 10, 11, 12, 13, 14, 15, 16, 17, 18, 19, 20, 21, 22, 23, 24, or more hours before the immune cell is passed through the immune modulating chamber, or about 1, 2, 3, 4, 5, 6, 7, or more days before the immune cell is passed through the immune modulating chamber. In other embodiments, the tumor cell is introduced into the immune modulating chamber concurrently with or after the immune cell is passed through the immune modulating chamber. In particular embodiments, the tumor cell is contained within a whole blood sample or immune cell-containing portion thereof, and becomes restrained on the solid support within the immune modulating chamber as the blood sample or immune cell-containing portion thereof passes through the immune modulating chamber.

In some embodiments, the tumor and/or stromal cell are restrained on the solid support by a capture moiety. In particular embodiments, the capture moiety also promotes tumor and/or stromal cell proliferation. In some embodiments, the capture moiety is chosen such that specific tumor cells and/or stromal cells are captured. Selective tumor and/or stromal cell capture is useful, for example, for subsequent biomarker analysis for diagnostic purposes and for guiding treatment (e.g., determining whether a therapy should be changed, discontinued, and/or started).

In some embodiments, the capture moiety is selected from the group consisting of an antibody, a cell adhesion molecule, and a combination thereof. In some instances, the antibody is an antibody that binds to epithelial cell adhesion molecule (EpCAM), alpha-fetoprotein (AFP), carcinoembryonic antigen (CEA), cancer antigen 125 (CA-125), MUC1, CD44, HER2, HER3, FGFR1, FGFR2, FGFR3, FGFR4, IGFR1, PD-L1, c-Met, EGFR, or a combination thereof. In some embodiments, the cell adhesion molecule is selected from the group consisting of a selectin, an integrin, vascular cell adhesion molecule 1 (VCAM1), and a combination thereof. In some instances, the selectin is selected from the group consisting of E-selectin, L-selectin, and a combination thereof.

The methods of the present invention are advantageous in that immune cells can obtain access to tumor cells without having to "infiltrate" into the tumor microenvironment. This advantage can be leveraged, for example, to increase the efficacy of immune checkpoints and other immune-oncology therapies described herein. In some embodiments, the immune modulating chamber further comprises a pro-immunogenic factor. In particular embodiments, the pro-immunogenic factor is an immune stimulating factor, an anti-immune inhibition factor, or a combination thereof. In some instances, the immune stimulating factor is selected from the group consisting of interleukin 2 (IL-2), interleukin 4 (IL-4), interleukin 5 (IL-5), interleukin 6 (IL-6), interleukin 12 (IL-12), interleukin 17 (IL-17), interleukin 22 (IL-22), C—X—C chemokine receptor type 3 (CXCR3), interferon gamma (INFγ), tumor necrosis factor alpha (TNFα), granulocyte-macrophage colony-stimulating factor (GM-CSF), and a combination thereof. In some embodiments, the anti-immune inhibition factor is selected from the group consisting of an immune checkpoint inhibitor, an indoleamine 2,3-dioxygnease (IDO) inhibitor, and a combination thereof In some instances, the immune checkpoint inhibitor inhibits programmed cell death 1 ligand 1 (PDL1), programmed cell death protein 1 (PD1), cytotoxic T lymphocyte associated protein 4 (CTLA4), T cell immunoglobulin 3 (TIM3), lymphocyte activation gene 3 (LAG3), V-domain Ig suppressor of T cell activation (VISTA), B and T lymphocyte attenuator (BTLA), or a combination thereof. The methods of the present invention provide the advantage of minimizing the effects of enzymes produced by myeloid-derived suppressor cells (MDSCs), among other cell types, by selectively capturing tumor cells away from MDSCs and by creating a hyper-immunoactivating environment that inhibits Treg activity.

Programmed cell death protein 1 (PD1) and protein death ligand 1 (PDL1) are common targets of immune checkpoint inhibitors, as disruption of the interaction between PD1 and PDL1 enhances the activity of immune cells against foreign cells such as cancer cells. Examples of PD1 inhibitors include pembrolizumab and nivolumab. An example of a PDL1 inhibitor is atezolizumab. Cytotoxic T lymphocyte-associated protein 4 (CTLA4) another target and is a receptor that downregulates immune cell responses. Therefore, drugs that inhibit CTLA4 can increase immune function. An example of such a drug is ipilimumab, which is a monoclonal antibody that binds to and inhibits CTLA4.

In some embodiments, the immune modulating chamber further comprises a subject-specific mutated peptide. In some instances, the subject-specific mutated peptide is selected from the group consisting of EGFRvIII peptide, p95HER2 peptide, an EGFR peptide comprising an activating mutation, and a combination thereof.

In some embodiments, the capture moiety, pro-immunogenic factor, and/or subject-specific mutated peptide are attached to the solid support. In other embodiments, the solid support comprises an interior surface of the immune modulating chamber or a support structure that is in contact with an interior surface of the immune modulating chamber, and optionally further comprises a magnetic composition. In particular embodiments, the support structure comprises a matrix. Examples of suitable matrices include, but are not limited to, agarose gels, Matrigel, collagen gels, hydrogels, and myogels. The strength of hydrogels can be adjusted by modifying properties such as pH and temperature during the polymerization process. In some embodiments, the solid support can comprise a microfluidic device. Tumor cells and/or materials can be restrained within a microfluidic channel and subjected to a constant directional flow (e.g., of blood or media) past the restrained cells. The flow provides shear stress, which can be combined with variations in channel materials, mechanical properties and matrix abundance to precisely modify the microenvironment in which the cells grow.

In some embodiments, the capture moiety, pro-immunogenic factor, and/or subject-specific mutated peptide are covalently attached to the solid support. In other embodiments, the capture moiety, pro-immunogenic factor, and/or subject-specific mutated peptide are magnetically attached to the solid support. In some embodiments, the capture moiety, pro-immunogenic factor, and/or subject-specific mutated peptide comprise a magnetic particle. In particular embodiments, the solid support comprises a magnetic composition and the capture moiety, pro-immunogenic factor, and/or subject-specific mutated peptide are magnetically attached to the magnetic composition. In other embodiments, an electromagnetic field that is external to the immune modulating chamber is used to magnetically attach the capture moiety, pro-immunogenic factor, and/or subject-specific mutated peptide to the solid support.

In some embodiments, the tumor cell is induced to undergo apoptosis by exposure to an oncolytic virus, radiation, and/or a chemotherapeutic agent. In other embodiments, the subject is administered a chimeric antigen receptor T-cell (CART cell). An advantage of the methods of the present invention is that CAR T cells, which normally have limited access to solid tumors in vivo, gain increased access to tumor cells within the immune modulating chamber. Furthermore, engagement between CAR T cells and tumor cells can be monitored using methods of the present invention. Monitoring can be diagnostic (e.g., detecting CAR T cell-tumor interactions and subsequent tumor cell destruction or lysis) and/or can be used to guide therapy (e.g., off-the-shelf or generic CAR T cells or NK cells against various tumor antigens can be screened to determine the most appropriate option).

Chemotherapeutic agents that can be used in the present invention include but are not limited to alkylating agents (e.g., nitrogen mustards (e.g., mechlorethamine, chlorambucil, cyclophosphamide, ifosfamide, melphalan), nitrosoureas (e.g., streptozocin, carmustine (BCNU), lomustine), alkyl sulfonates (e.g., busulfan), triazines (e.g., dacarbazine (DTIC), temozlomide), ethylenimines (e.g., thiotepa, altretamine (hexamethylmelamine))), platinum drugs (e.g., cisplatin, carboplatin, oxalaplatin), antimetabolites (e.g., 5-fluorouracil (5-FU), 6-mercaptopurine (6-MP), capecitabine, cytarabine, floxuridine, fludarabine, gemcitabine, hydroxyurea, methotrexate, pemetrexed), anthracycline anti-tumor antibiotics (e.g., daunorubicin, doxorubicin, epirubicin, idarubicin), non-anthracycline anti-tumor antibiotics (e.g., actinomycin-D, bleomycin, mitomycin-C, mitoxantrone), mitotic inhibitors (e.g., taxanes (e.g., paclitaxel, docetaxel), epothilones (e.g., ixabepilone), vinca alkaloids (e.g., vinblastine, vincristine, vinorelbine), estramustine), corticosteroids (e.g., prednisone, methylprednisolone, dexamethasone), L-asparaginase, bortezomib, and topoisomerase inhibitors. Combinations of chemotherapeutic agents can be used.

Topoisomerase inhibitors are compounds that inhibit the activity of topoisomerases, which are enzymes that facilitate changes in DNA structure by catalyzing the breaking and rejoining of phosphodiester bonds in the backbones of DNA strands. Such changes in DNA structure are necessary for DNA replication during the normal cell cycle. Topoisomerase inhibitors inhibit DNA ligation during the cell cycle, leading to an increased number of single- and double-stranded breaks and thus a degradation of genomic stability. Such a degradation of genomic stability leads to apoptosis and cell death.

Topoisomerases are often divided into type I and type II topoisomerases. Type I topoisomerases are essential for the relaxation of DNA supercoiling during DNA replication and transcription. Type I topoisomerases generate DNA single-strand breaks and also religate said breaks to re-establish an intact duplex DNA molecule. Examples of inhibitors of topoisomerase type I include irinotecan, topotecan, camptothecin, and lamellarin D, which all target type IB topoisomerases.

Type II topoisomerase inhibitors are broadly classified as topoisomerase poisons and topoisomerase inhibitors. Topoisomerase poisons target topoisomerase-DNA complexes, while topoisomerase inhibitors disrupt enzyme catalytic turnover. Examples of type II topoisomerase inhibitors include amsacrine, etoposide, etoposide phosphate, teniposide, doxorubicin, and fluoroquinolones.

Immunotherapeutic compounds can also be used. In some instances, an immunotherapeutic agent comprises a monoclonal antibody that targets a particular type or part of a cancer cell. In some cases, the antibody is conjugated to a moiety such as a drug molecule or a radioactive substance. Antibodies can be derived from mouse, chimeric, or humanized, as non-limiting examples. Non-limiting examples of therapeutic monoclonal antibodies include alemtuzumab, bevacizumab, cetuximab, daratumumab, ipilimumab (MDX-101), nivolumab, ofatumumab, panitumumab, pembrolizumab, rituximab, tositumomab, and trastuzumab.

Radiation therapy can comprise the delivery of X-rays, gamma rays, and/or charged particles.

In some embodiments, a small molecule drug is used. Small molecule drugs generally are pharmacological agents that have a low molecular weight (i.e., less than about 900 daltons). Non-limiting examples of small molecule drugs used to treat cancer include bortezomib (a proteasome inhibitor), imatinib (a tyrosine kinase inhibitor), and seliciclib (a cyclin-dependent kinase inhibitor), and epacadostat (an indoleamine 2,3-dioxygenase (IDO1) inhibitor).

Methods of the present invention are also useful for augmenting bispecific T cell engagers. By introducing these modified antibodies into the localized environment of the immune modulating chamber, the ability of bispecific T cell engagers to force interactions between immune cells and tumor cells is improved.

In some embodiments, the immune modulating chamber further comprises a flow regulator. In other embodiments, the immune modulating chamber further comprises a pump. In some embodiments, the flow regulator and/or the pump are used to adjust the rate at which the immune cell passes through the immune modulating chamber. In some embodiments, the speed of the pump is varied in order to increase or decrease the flow rate through the immune modulating chamber. In particular embodiments, the immune cell is present in a whole blood sample or an immune cell-containing portion thereof.

Adjusting the flow rate is useful, for example, for optimizing the exposure of immune cells to captured cells (e.g., tumor cells, stromal cells) that are restrained within the immune modulating chamber. As a non-limiting example, the flow rate can be reduced in order to increase the amount of time that an immune cell is present within the immune modulating chamber, thus increasing the available interaction time with the tumor and/or stromal cell. Alternatively, if it is desirable to increase the number of immune cells that pass through the immune modulating chamber per unit of time, the flow rate can be increased.

Adjusting the flow rate is also useful, for example, for optimizing the capture or restraining of cells, such as circulating tumor cells, as they pass through the immune modulating chamber. The cells to be captured can be present in a whole blood sample, or a portion thereof, as it passes through the immune modulating chamber. The flow rate can be adjusted using the flow regulator and/or the pump (e.g., by varying the pump speed). As a non-limiting example, the flow rate can be decreased to increase the amount of time that a cell to be captured is present within the immune modulating chamber, thus increasing the probability that the cell will be captured and restrained by a capture moiety. Alternatively, the flow rate can be increased to increase the number of cells that pass through the immune modulating chamber per unit of time, thus increasing the number of cells that are available for capture within the immune modulating chamber. In some embodiments, the flow rate is adjusted depending on the stage of treatment (e.g., cancer treatment). As a non-limiting example, a particular flow rate can be selected during the early stage of treatment when cells (e.g., circulating tumor cells) need to be captured or restrained within the immune modulating chamber, and a different flow rate (e.g., a higher or lower flow rate) can be selected later during treatment, when a sufficient number of cells have been captured. In some instances, the rate of capture of cells (e.g. tumor cells) will be of higher importance at one stage of treatment (e.g., at an earlier stage, or after an immune modulating chamber has been replaced), and the exposure time of immune cells to captured cells within the immune modulating chamber will be of higher importance at other stages of treatment.

In particular embodiments, the availability of oxygen inside the immune modulating chamber is controlled by using the flow regulator and/or the pump to adjust the flow rate of whole blood through the immune modulating chamber and/or by adjusting the number or density of red blood cells passing through the immune modulating chamber. In general, an increased number or density of red blood cells within the chamber will correlate with a higher availability of oxygen within the immune modulating chamber. In some embodiments, it is desirable to create a hypoxic environment within the immune modulating chamber, and the flow regulator and/or pump is used (e.g., by varying the pump speed) are used to reduce the number or density of cells within the immune modulating chamber.

In some embodiments, multiple immune modulating chambers are used. In particular embodiments, the multiple immune modulating chambers are each in fluid communication with each other. In some embodiments, each of the multiple immune modulating chambers comprises a different tumor cell. An advantage of this approach is that the methods of the present invention can mimic the presence of metastatic cancer sites within a subject. Any number of immune modulating chambers can be used (e.g., 1, 2, 3, 4, 5, 6, 7, 8, 9, 10, or more chambers).

In some embodiments, a first immune modulating chamber is replaced with a second immune modulating chamber. An immune modulating chamber can be removed (e.g., from fluid communication with the subject or other circulatory network) and replaced with a new immune modulating chamber any number of times (e.g., 1, 2, 3, 4, 5, 6, 7, 8, 9, 10, or more times), depending on the duration that a subject's immune cells are being activated according to the methods of the present invention, and other factors. In some embodiments, the tumor cell is removed from the immune modulating chamber after the immune cell has passed through the immune modulating chamber, and the presence or level of one or more biomarkers in the tumor cell is detected. The immune cell can be removed from the immune modulating chamber while the immune modulating chamber is still in fluid communication with the subject or other circulatory network, or after the immune modulating chamber has been removed from fluid communication with the subject or other circulatory network (e.g., when a first immune modulating chamber is removed and replaced with a second immune modulating chamber). In some instances, the presence or level of the one or more biomarkers is used to provide a diagnosis to the subject and/or select a treatment for a disease in the subject.

As a non-limiting example, the presence and/or level of one or more biomarkers can be detected or measured in a tumor cell and/or stromal material (e.g., stromal cell) for the purposes of determining whether a subject is responding to immune cell activation according to methods of the present invention, to another therapeutic method, or a combination thereof. In some embodiments, an increase or decrease in the presence or level of a biomarker will indicate that immune cell activation or other therapy is effective. In other embodiments, an increase or decrease in the presence or level of a biomarker will indicate that immune cell activation or other therapy is not effective, in which case a change in therapy may be needed. In some embodiments, the presence or level of one or more biomarkers is used to select an appropriate therapy for a subject (e.g., to determine the emergence of a new disease-causing mutation, to determine a mechanism of disease resistance, the activation and/or inactivation of particular signaling pathways). In some embodiments, the an immunity index is determined, wherein the composition of a tumor microenvironment (e.g., associated immune cells, tumor cells, stromal materials) that has been recreated within an immune modulating chamber is used to determine a mechanism of non-response to an immunotherapy. By detecting the presence or level of biomarkers, the methods of the present invention are useful for real-time surveillance (e.g., of a tumor cell response) and/or biomarker drift.

In some embodiments, the measuring or detecting the level of a biomarker comprises measuring or detecting an activation state (i.e., whether or not a biomarker is activated) or an activation level (i.e., the extent to which a biomarker is activated) of the biomarker. In particular embodiments, the activation state corresponds to the phosphorylation, ubiquination, and/or complexation status of the biomarker (e.g., a protein or signal transduction molecule). Examples of activation states (shown in parentheses) include, but are not limited to, HER1/EGFR (EGFRvIII, phosphorylated (p-) EGFR, EGFR:Shc, ubiquitinated (u-) EGFR, p-EGFRvIII); ErbB2 (p-ErbB2, p95HER2 (truncated ErbB2), p-p95HER2, ErbB2:Shc, ErbB2:PI3K, ErbB2:EGFR, ErbB2:ErbB3, ErbB2:ErbB4); ErbB3 (p-ErbB3, truncated ErbB3, ErbB3: PI3K, p-ErbB3:PI3K, ErbB3:Shc); ErbB4 (p-ErbB4, ErbB4: Shc); c-MET (p-c-MET, truncated c-MET, c-Met:HGF complex); AKT1 (p-AKT1); AKT2 (p-AKT2); AKT3 (p-AKT3); PTEN (p-PTEN); P70S6K (p-P70S6K); MEK (p-MEK); ERK1 (p-ERK1); ERK2 (p-ERK2); PDK1 (p-PDK1); PDK2 (p-PDK2); SGK3 (p-SGK3); 4E-BP1 (p-4E-BP1); PIK3R1 (p-PIK3R1); c-KIT (p-c-KIT); ER (p-ER); IGF-1R (p-IGF-1R, IGF-1R:IRS, IRS:PI3K, p-IRS, IGF-1R:PI3K); INSR (p-INSR); FLT3 (p-FLT3); HGFR1 (p-HGFR1); HGFR2 (p-HGFR2); RET (p-RET); PDGFRA (p-PDGFRA); PDGFRB (p-PDGFRB); VEGFR1 (p-VEGFR1, VEGFR1:PLCγ, VEGFR1:Src); VEGFR2 (p-VEGFR2, VEGFR2:PLCγ, VEGFR2:Src, VEGFR2: heparin sulphate, VEGFR2:VE-cadherin); VEGFR3 (p-VEGFR3); FGFR1 (p-FGFR1); FGFR2 (p-FGFR2); FGFR3 (p-FGFR3); FGFR4 (p-FGFR4); TIE1 (p-TIE1); TIE2 (p-TIE2); EPHA (p-EPHA); EPHB (p-EPHB); GSK-3β (p-GSK-3β); NFKB (p-NFKB), IKB (p-IKB, p-P65: IKB); BAD (p-BAD, BAD:14-3-3); mTOR (p-mTOR); Rsk-1 (p-Rsk-1); Jnk (p-Jnk); P38 (p-P38); STAT1 (p-STAT1); STAT3 (p-STAT3); FAK (p-FAK); RB (p-RB); Ki67; p53 (p-p53); CREB (p-CREB); c-Jun (p-c-Jun); c-Src (p-c-Src); paxillin (p-paxillin); GRB2 (p-GRB2), Shc (p-Shc), Ras (p-Ras), GAB1 (p-GAB1), SHP2 (p-SHP2), GRB2 (p-GRB2), CRKL (p-CRKL), PLCγ (p-PLCγ), PKC (e.g., p-PKCα, p-PKCβ, p-PKCδ), adducin (p-adducin), RB1 (p-RB1), and PYK2 (p-PYK2).

In some embodiments, the biomarker is a signal transduction molecule. Signal transduction molecules include molecules and proteins that play various roles in the transmission of an extracellular signal (e.g., a stimulus) and translating it into a response (e.g., one or more biochemical processes that occur inside a cell). Non-limiting examples of signal transduction molecules include receptor tyrosine kinases (RTKs) such as EGFR (e.g., EGFR/HER1/ErbB1, HER2/Neu/ErbB2, HER3/ErbB3, HER4/ErbB4), VEGFR1/FLT1, VEGF2/FLK1/KDR, VEGFR3/FLT4, FLT3/FLK2, PDGFR (e.g., PDGFRA, PDGFRB), c-KIT/SCFR, INSR (insulin receptor), IGF-IR, IGF-IIR, IRR (insulin receptor-related receptor), CSF-1R, FGFR 1-4, HGFR 1-2, CCK4, TRK A-C, c-MET, RON, EPHA 1-8, EPHB 1-6, AXL, MER, TYRO3, TIE 1-2, TEK, RYK, DDR 1-2, RET, c-ROS, V-cadherin, LTK (leukocyte tyrosine kinase), ALK (anaplastic lymphoma kinase), ROR 1-2, MUSK, AATYK 1-3, and RTK 106; truncated forms of receptor tyrosine kinases such as truncated HER2 receptors with missing amino-terminal extracellular domains (e.g., p95ErbB2 (p95m), p110, p95c, p95n, etc.), truncated cMET receptors with missing amino-terminal extracellular domains, and truncated HER3 receptors with missing amino-terminal extracellular domains; receptor tyrosine kinase dimers (e.g., p95HER2/HER3; p95HER2/HER2; truncated HER3 receptor with HER1, HER2, HER3, or HER4; HER2/HER2; HER3/HER3; HER2/HER3; HER1/HER2; HER1/HER3; HER2/HER4; HER3/HER4; etc.); non-receptor tyrosine kinases such as BCR-ABL, Src, Frk, Btk, Csk, Abl, Zap70, Fes/Fps, Fak, Jak, Ack, and LIMK; tyrosine kinase signaling cascade components such as AKT (e.g., AKT1, AKT2, AKT3), MEK (MAP2K1), ERK2 (MAPK1), ERK1 (MAPK3), PI3K (e.g., PIK3CA (p110), PIK3R1 (p85)), PDK1, PDK2, phosphatase and tensin homolog (PTEN), SGK3, 4E-BP1, P70S6K (e.g., p70 S6 kinase splice variant alpha I), protein tyrosine phosphatases (e.g., PTP1B, PTPN13, BDP1, etc.), RAF, PLA2, MEKK, JNKK, JNK, p38, Shc (p66), Ras (e.g., K-Ras, N-Ras, H-Ras), Rho, Rac1, Cdc42, PLC, PKC, p53, cyclin D1, STAT1, STAT3, phosphatidylinositol 4,5-bisphosphate (PIP2), phosphatidylinositol 3,4,5-trisphosphate (PIP3), mTOR, BAD, p21, p27, ROCK, IP3, TSP-1, NOS, GSK-3β, RSK 1-3, JNK, c-Jun, Rb, CREB, Ki67, and paxillin; nuclear hormone receptors such as estrogen receptor (ER), progesterone receptor (PR), androgen receptor, glucocorticoid receptor, mineralocorticoid receptor, vitamin A receptor, vitamin D receptor, retinoid receptor, thyroid hormone receptor, and orphan receptors; nuclear receptor coactivators and repressors such as amplified in breast cancer-1 (AIB1) and nuclear receptor corepressor 1 (NCOR), respectively; and combinations thereof. Other non-limiting examples of signal transduction molecules include G-protein coupled receptors (GPCRs), including those that function in the cAMP signaling pathway and those that function in the phosphatidylinositol signaling pathway.

In some embodiments, determining the presence of a biomarker comprises detecting the presence of a particular genotype. In particular embodiments, the presence of one or more mutations in a gene (e.g., an oncogene) is detected. Oncogenes are genes that have the potential to cause cancer. Non-limiting examples of oncogenes include growth factors or mitogens such as c-Sis; receptor tyrosine kinases such as EGFR, HER2, PDGFR, and VEGFR; cytoplasmic tyrosine kinases such as Abl and kinases in the Src-family, Syk-ZAP-70 family, and BTK family of tyrosine kinases; cytoplasmic serine/threonine kinases and their regulatory subunits such as PIK3CA, PIK3R1, and RAF (e.g., RAF-1, A-RAF, B-RAF); regulatory GTPases such as RAS (e.g., KRAS); transcription factors such as MYC; and combinations thereof. Non-limiting examples of KRAS mutations include G12S, G12D, G12A, G12V, G12R, G12C, and G13D. Non-limiting examples of BRAF mutations include V600E, R461I, I462S, G463E, G463V, G465A, G465E, G465V, G468A, G468E, N580S, E585K, D593V, F59L, G595R, L596V, T598I, V599D, V599E, V599K, V599R, K600E, and A727V. Non-limiting examples of PIK3CA mutations include E545A, E545G, E545K, Q546E, Q546K, H1047R, H1047L, and 3204insA. Non-limiting examples of EGFR mutations include deletions in exon 19 such as L858R, G719S, G719S, G719C, L861Q and S768I, as well as insertions in exon 20 such as T790M. In some instances, combinations of more than one mutation in a gene are detected. In other instances, mutations in more than one gene are detected.

Genotyping of a nucleic acid from an individual, whether amplified or not, can be performed using any of various techniques. Useful techniques include, without limitation, assays such as polymerase chain reaction (PCR) based analysis assays, sequence analysis assays, electrophoretic analysis assays, restriction length polymorphism analysis assays, hybridization analysis assays, allele-specific hybridization, oligonucleotide ligation allele-specific elongation/ligation, allele-specific amplification, single-base extension, molecular inversion probe, invasive cleavage, selective termination, restriction length polymorphism, sequencing, single strand conformation polymorphism (SSCP), single strand chain polymorphism, mismatch-cleaving, and denaturing gradient gel electrophoresis, all of which can be used alone or in combination. As used herein, the term "nucleic acid" includes a polynucleotide such as a single- or double-stranded DNA or RNA molecule including, for example, genomic DNA, cDNA, microRNA, and mRNA. This term encompasses nucleic acid molecules of both natural and synthetic origin as well as molecules of linear, circular, or branched configuration representing either the sense or antisense strand, or both, of a native nucleic acid molecule. It is understood that such nucleic acids can be unpurified, purified, or attached, for example, to a synthetic material such as a bead or column matrix.

Material containing nucleic acid is routinely obtained from individuals. Such material is any biological matter from which nucleic acid can be prepared. As non-limiting examples, material can be whole blood, serum, plasma, saliva, cheek swab, sputum, or other bodily fluid or tissue that contains nucleic acid. In one embodiment, a method of the present invention is practiced with whole blood, which can be obtained readily by non-invasive means and used to prepare genomic DNA. In another embodiment, genotyping involves amplification of an individual's nucleic acid using the polymerase chain reaction (PCR). Use of PCR for the amplification of nucleic acids is well known in the art (see, e.g., Mullis et al. (Eds.), *The Polymerase Chain Reaction*, Birkhäuser, Boston, (1994)). In yet another embodiment, PCR amplification is performed using one or more fluorescently labeled primers. In a further embodiment, PCR amplification is performed using one or more labeled or unlabeled primers that contain a DNA minor groove binder.

One of skill in the art will readily know of methods to detect or measure the level of various biomarkers. As a non-limiting example, the levels and/or activation states of biomarkers (e.g., signal transduction molecules) in tumor cells (e.g., circulating tumor cells) can be detected or measured using antibody-based methods such as those described in U.S. Pat. No. 8,658,388, issued Feb. 25, 20154, the disclosure of which is herein incorporated by reference in its entirety for all purposes.

Methods of the present invention are also useful for enhancing or increasing the efficacy of therapeutic vaccination. As a non-limiting example, vaccine cells, antigenic peptides, patient-specific mutated peptides, and/or oncolytic viruses can be introduced into the immune modulating chamber. The localized environment within the immune modulating chamber increases the exposure of immune cells and/or tumor cells to vaccine agents. Furthermore, the methods of the present invention are useful for enhancing therapies such as oncolytic virus treatment, radiation treatment, and/or chemotherapy. These therapies induce inflammatory cytokines and attract innate immune cells that phagocytose damaged tumor cells and induce them to undergo cross-presentation of tumor antigens in the context of MHC, which results in the activation of tumor-specific leukocytes. By introducing oncolytic viruses, radiation, and/or chemotherapeutic agents into the immune modulating chamber environment, exposure of tumor cells can be maximized, thus increasing the activation of immune cells, while at the same time minimizing systemic adverse effects to the subject.

In another aspect, the present invention provides a method for treating cancer in a subject. In some embodiments, the method comprises activating an immune cell according to a method of the present invention. In particular embodiments, the cancer comprises a solid tumor.

Non-limiting examples of cancers that can be treated according to the methods of the present invention include gynecological cancers (e.g., ovarian, cervical, uterine, vaginal, and vulvar cancers); lung cancers (e.g., non-small cell lung cancer, small cell lung cancer, mesothelioma, carcinoid tumors, lung adenocarcinoma); breast cancers (e.g., triple-negative breast cancer, ductal carcinoma in situ, invasive ductal carcinoma, tubular carcinoma, medullary carcinoma, mucinous carcinoma, papillary carcinoma, cribriform carcinoma, invasive lobular carcinoma, inflammatory breast cancer, lobular carcinoma in situ, Paget's disease, Phyllodes tumors); digestive and gastrointestinal cancers such as gastric cancer (e.g., stomach cancer), colorectal cancer, gastrointestinal stromal tumors (GIST), gastrointestinal carcinoid tumors, colon cancer, rectal cancer, anal cancer, bile duct cancer, small intestine cancer, and esophageal cancer; thyroid cancer; gallbladder cancer; liver cancer; pancreatic cancer; appendix cancer; prostate cancer (e.g., prostate adenocarcinoma); renal cancer (e.g., renal cell carcinoma); cancer of the central nervous system (e.g., brain cancers such as glioblastoma, neuroblastoma, medulloblastoma); skin cancer (e.g., melanoma); bone and soft tissue sarcomas (e.g., Ewing's sarcoma); lymphomas; choriocarcinomas; urinary cancers (e.g., urothelial bladder cancer); head and neck cancers; bone marrow and blood cancers (e.g., acute leukemia, chronic leukemia (e.g., chronic lymphocytic leukemia), lymphoma, multiple myeloma), and a combination thereof. As used herein, a "tumor" comprises one or more cancerous cells.

In some embodiments, the cancer is selected from the group consisting of lung cancer, brain cancer, breast cancer, gastric cancer, colorectal cancer, prostate cancer, ovarian cancer, melanoma, a sarcoma, and a combination thereof.

In another aspect, the present invention provides a method for inducing an immune response against a tumor in a subject. In some embodiments, the method comprises activating an immune cell according to a method of the present invention. In some embodiments, the tumor comprises a tumor cell that is similar to the tumor cell that is restrained within the immune modulating chamber (e.g., restrained on the solid support within the immune modulating chamber). In some embodiments, the tumor comprises a tumor cell that is that is the same type of tumor cell that is restrained within the immune modulating chamber (e.g., restrained on the solid support within the immune modulating chamber). In some embodiments, the tumor is a solid tumor.

The tumor can be from, as non-limiting examples, a gynecological cancer (e.g., ovarian, cervical, uterine, vaginal, or vulvar cancer); a lung cancer (e.g., non-small cell lung cancer, small cell lung cancer, mesothelioma, a carcinoid tumor, lung adenocarcinoma); a breast cancer (e.g., triple-negative breast cancer, ductal carcinoma in situ, invasive ductal carcinoma, tubular carcinoma, medullary carcinoma, mucinous carcinoma, papillary carcinoma, cribriform carcinoma, invasive lobular carcinoma, inflammatory breast cancer, lobular carcinoma in situ, Paget's disease, Phyllodes tumor); a digestive or gastrointestinal cancer such as gastric cancer (e.g., stomach cancer), colorectal cancer, a gastrointestinal stromal tumor (GIST), a gastrointestinal carcinoid tumor, colon cancer, rectal cancer, anal cancer, bile duct cancer, small intestine cancer, or esophageal cancer; thyroid cancer; gallbladder cancer; liver cancer; pancreatic cancer; appendix cancer; prostate cancer (e.g., prostate adenocarcinoma); renal cancer (e.g., renal cell carcinoma); cancer of the central nervous system (e.g., a brain cancer such as glioblastoma, neuroblastoma, or medulloblastoma); skin cancer (e.g., melanoma); a bone or soft tissue sarcoma (e.g., Ewing's sarcoma); a lymphoma; a choriocarcinoma; a urinary cancer (e.g., urothelial bladder cancer); a head or neck cancer; a bone marrow or blood cancers (e.g., acute leukemia, chronic leukemia (e.g., chronic lymphocytic leukemia), lymphoma, multiple myeloma), or a combination thereof.

In some embodiments, the tumor is from a cancer selected from the group consisting of lung cancer, brain cancer, breast cancer, gastric cancer, colorectal cancer, prostate cancer, ovarian cancer, melanoma, a sarcoma, and a combination thereof.

Methods of the present invention can be performed for any suitable period of time. In some embodiments, an immune cell in a subject is activated (e.g., for cancer treatment) for about 1, 2, 3, 4, 5, 6, 7, 8, 9, 10, 11, 12, 13, 14, 15, 16, 17, 18, 19, 20, 21, 22, 23, 24, or more hours. In other embodiments, an immune cell in a subject is activated for about 1, 2, 3, 4, 5, 6, 7, or more days. In still other embodiments, an immune cell in a subject is activated for about 1, 2, 3, 4, or more weeks, or about 1, 2, 3, 4, 5, 6, 7, 8, 9, 10, 11, 12, or more months. The methods of the present invention can be used to activate immune cells continuously, or intermittently. In some embodiments, methods of the present invention are used to activate immune cells in a subject on 1, 2, 3, 4, 5, 6, 7, 8, 9, 10, or more separate occasions.

In some embodiments, treating the subject (e.g., by activating an immune cell in a subject according to methods of the present invention) or inducing an immune response against a tumor (e.g., by activating an immune cell in a subject according to methods of the present invention) comprises inhibiting cancer cell growth, inhibiting cancer cell proliferation, inhibiting cancer cell migration, inhibiting cancer cell invasion, ameliorating or eliminating the symptoms of cancer, reducing the size (e.g., volume) of a cancer tumor, reducing the number of cancer tumors, reducing the number of cancer cells, inducing cancer cell necrosis, pyroptosis, oncosis, apoptosis, autophagy, or other cell death, or enhancing the therapeutic effects of a composition or pharmaceutical composition. In some embodiments, treating the subject or inducing the immune response against a tumor results in an increased survival time. In some instances, overall survival is increased. In other instances, disease-free survival is increased. In some instances, progression-free survival is increased. In particular embodiments, treating the subject or inducing an immune response against a tumor results in a reduction in tumor volume and/or increased survival time.

In particular embodiments, treating the subject or inducing an immune response against a tumor enhances the therapeutic effects of an anti-cancer therapy such as a chemotherapeutic agent, an immunotherapeutic agent, radiotherapy, hormone therapy, a differentiating agent, and/or a small-molecule drug.

IV. EXAMPLES

The present invention will be described in greater detail by way of specific examples. The following examples are offered for illustrative purposes only, and are not intended to limit the invention in any manner.

Example 1

Humanized Mouse Model

This example describes the use of a humanized mouse model to demonstrate the ability of the methods of the present invention to activate tumor-targeting autologous leukocytes and increase their ability to kill tumor cells.

Figure 5:
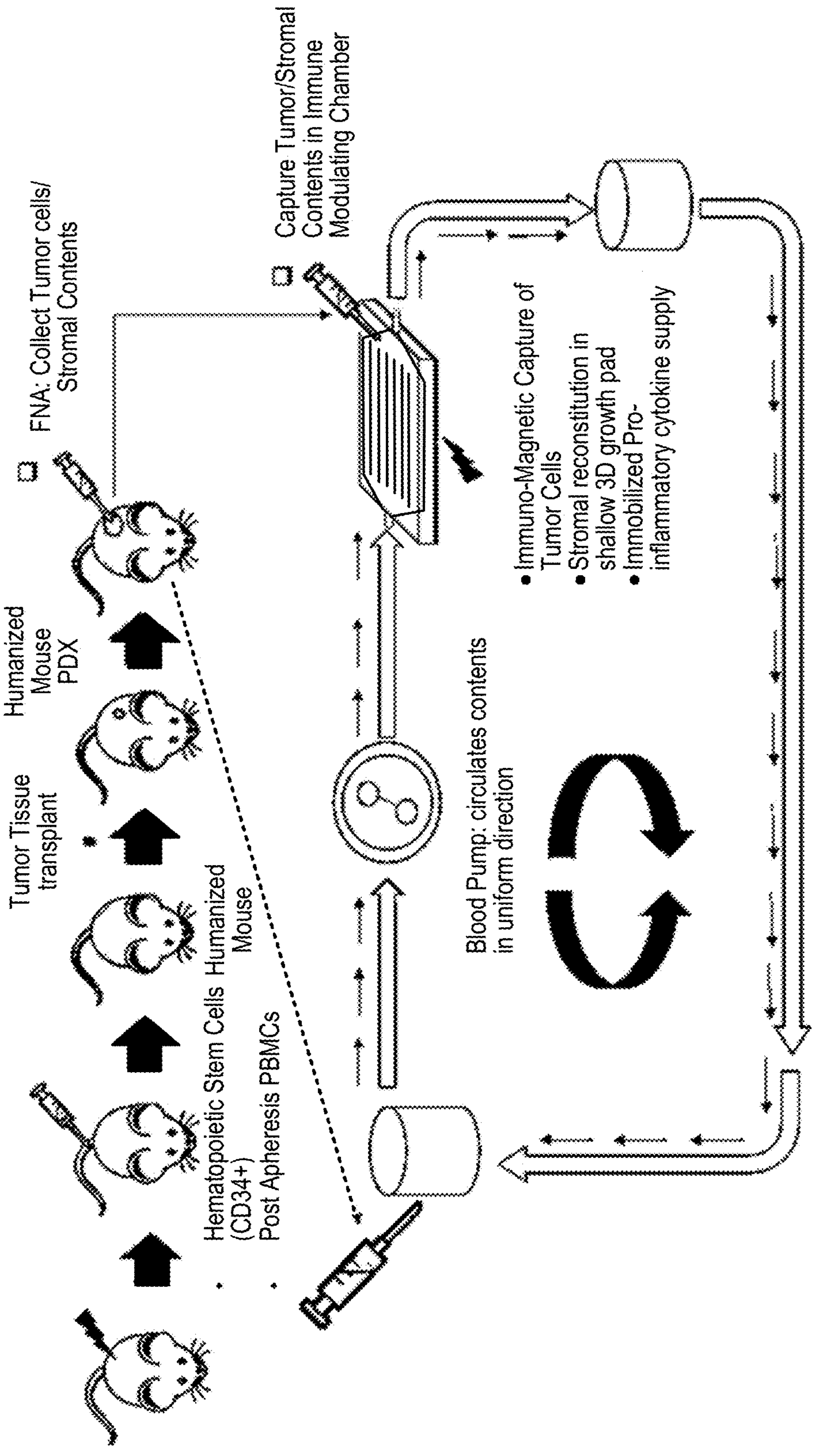
FIG. 5 shows a schematic of the humanized mouse model study described in Example 1. Humanized mice (shaded) are created by the injection of $CD34^+$ cells into immunodeficient mice. Subsequently, the humanized mice are subcutaneously inoculated with a patient-derived tumor xenograft. Once the tumor reaches an appropriate size, a fine needle aspirate sample is obtained and introduced into the immune modulating chamber. Peripheral blood mononuclear cells (PBMCs) are also obtained from the humanized mouse and passed through the immune modulating chamber by a circulating pump, where they are exposed to the tumor cells and become activated.

Humanized NSG-SGM3 mice (available from Jackson Laboratories in Bar Harbor, Me.) are used for the study. Generation of the humanized mouse model is depicted in FIG. 5. NSG-SGM3 are highly immunodeficient mice and can be used to engraft human hematopoietic stem cells for the generation of the humanized mouse model. These mice produce human stem cell factor (SCF), granulocyte/macrophage stimulating factor (GM-CSF), and interleukin-2 (IL2), the expression of which is driven by a cytomegalovirus promoter.

The humanized NSG-SGM3 mice are kept and bred in a specific pathogen-free animal facility. Mice that are newborn or are 3 to 4 weeks of age are sub-lethally irradiated (e.g., using a dose of 1 Gy). Subsequently, the mice receive a tail vein injection comprising $2\times10^5$ $CD34^+$ stem cells, isolated from human cord blood using the MACS cell separation system according to the manufacturer's protocol (Miltenyi Biotech). Alternatively, the mice are injected by tail vein with $CD34^+$ stem cells enriched from peripheral blood mononuclear cells (PBMCs) collected via an apheresis procedure from a cancer patient. Engraftment of the human hematopoietic cells is verified in one mouse by obtaining PBMCs 12 weeks post-tail vein injection. Analysis is performed using flow cytometry with probes against various types of leukocytes (e.g., hu-CD45+, hu-CD3+) to quantify myeloid cell populations (e.g., macrophages, monocytes, neutrophils, basophils, Mmst cells, erythroid progenitors) and lymphoid cell populations (e.g., CD4+ and CD8+ T cells, Tregs, B cells, NK cells).

Subsequently, patient-derived xenograft (PDX) tumors are subcutaneously implanted into the humanized CD34-NSG-SGM3 (hu-CD34-NSG-SGM3) mice (depicted as shaded mice in FIG. 5). When the PDX tumors reach the appropriate size (e.g., about 6 to 8 weeks after implantation), an immune modulating chamber is prepared using tumor cells and stromal materials (e.g., stromal cells, stromal components) that are collected (e.g., collected by fine needle aspiration (FNA)) and introduced into the immune modulating chamber. The tumor cells and stromal materials are incubated for 24 hours at 37° C. with $CO_2$ in a tissue culture incubator. During collection and/or incubation, adequate media are provided. In addition, the cells and stromal materials are incubated, as appropriate, with pro-inflammatory cytokines (e.g., IL2, IL7, IL12, IL15, IL18, IL21, IFNβ, TNFα, GM-CSF). By limiting these stimulatory cytokines to the confines of the immune modulating chamber, systemic toxic effects associated with high concentrations of these agents can be avoided in a subject. In addition, by co-incubating the tumor-specific leukocytes and tumor cells in the immune modulating chamber, the tumor-specific leukocytes can readily recognize the tumor cells without having to "infiltrate" a stromal layer. Furthermore, available immune-oncology agents, as appropriate, are added to the immune modulating chamber to enhance specific immune activation. Appropriate immune-oncology agents include, but are not limited to, immune checkpoint inhibitors (e.g., anti-CTLA4, anti-PD1, anti-PDL1, anti-OX40, and anti-CD137 antibodies) and indoleamine 2,3-dioxygenase (IDO) inhibitors.

After the 24-hour incubation time, the immune modulating chamber containing the captured tumor and stromal materials is connected to an ex vivo circulatory network as shown in FIG. 5. The circulatory network is maintained in a tissue culture incubator.

PBMCs are collected intravenously from the hu-CD34-NSG-SGM3 mice every 5 days via the lateral saphenous vein using a 1 mL syringe with a 22-gauge hypodermic needle. This procedure comprises anesthetizing the mouse, clipping hair from the lateral aspect of the lower leg, prepping the procedure site with an alcohol swab and allowing to dry, applying a thin film of petroleum-based lubricant over the puncture site, constricting the lateral saphenous vein above the knee joint between the thumb and index finger, and collecting between about 200 μL and 300 μL of blood. The collected PBMCs are subsequently introduced into the immune modulating chamber.

Figure 6:
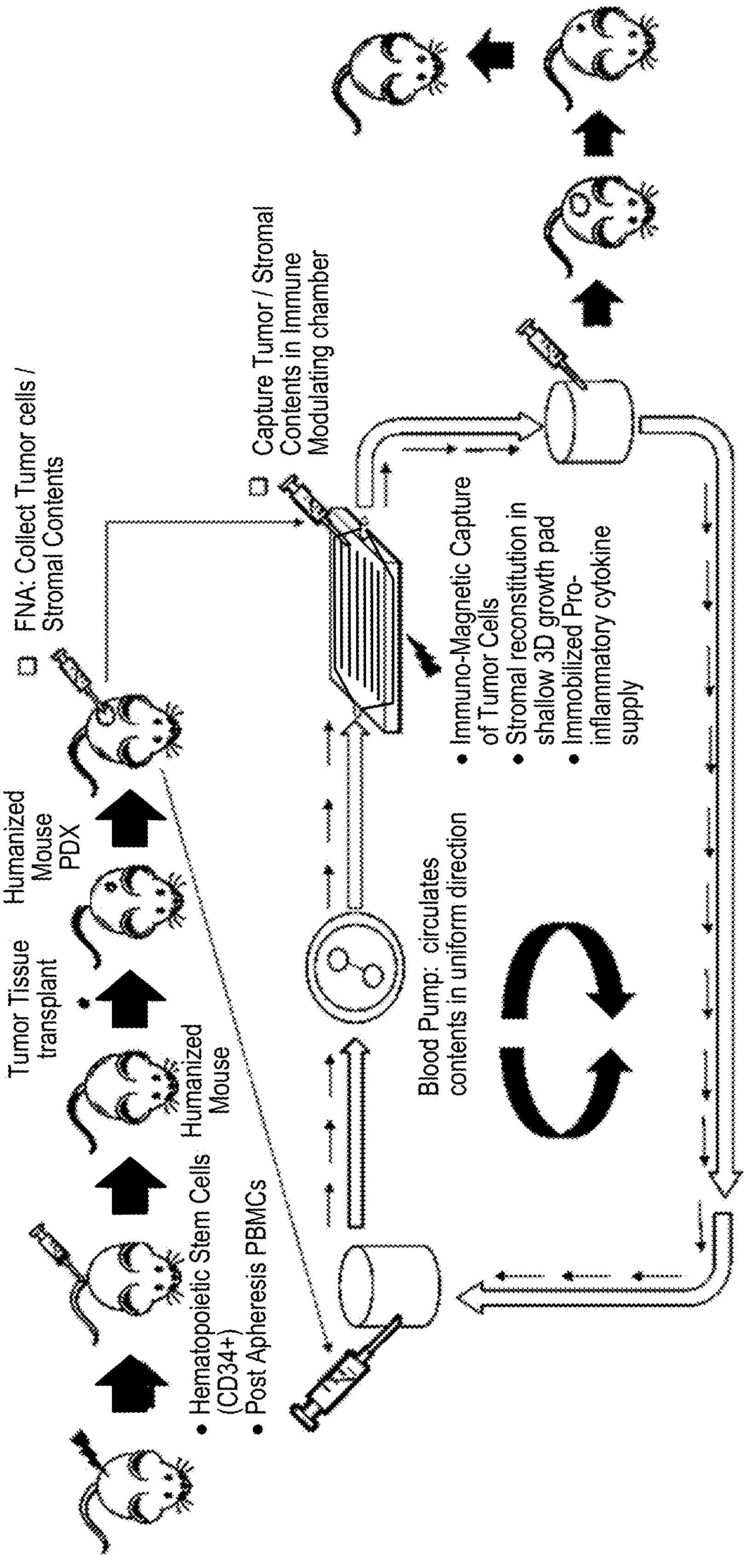
FIG. 6 shows a schematic of a later stage of the humanized mouse study described in Example 1. Immune cells that have been activated by passing through the immune modulating chamber are withdrawn and injected into the humanized mouse tumor model, and tumor size is monitored for changed.

After immune cells are exposed to tumor cells and stromal materials in the immune modulating chamber, the response of tumor cells within the immune modulating chamber is evaluated (FIG. 6). In order to evaluate the ability of immune cells activated by methods of the present invention to inhibit tumor cell growth, activated PBMCs (e.g., about 250 μL) are collected from the ex vivo circulatory network and injected into a mouse with residual tumor. The mouse is prepared for intravenous injection (e.g., via lateral tail vein) by warming the tail (e.g., wrapping the tail in an electric heating pad that is warm (but not hot) to the touch), placing a tourniquet around the base of the tail to facilitate visualization of the vein, and restraining the mouse (e.g., in a Plexiglas restrainer). The activated PBMCs are injected into the mouse by inserting a 27-gauge hypodermic needle attached to a 1 mL syringe into the skin approximately parallel with the vein. The injection procedure is repeated daily (e.g., for a total of about five times) and the tumor volume in the mouse is monitored for changes.

Example 2

In Vitro Apheresis-Tumor Model

This example describes the use of an in vitro model to demonstrate the ability of the methods of the present invention to activate tumor-targeting autologous leukocytes and increase their ability to kill tumor cells. In particular, this example demonstrates the use of a second immune modulating chamber that serves as an in vitro surrogate for a subject to be treated by methods of the present invention.

In this study, a fine needle aspirate (FNA) sample and a core biopsy sample are obtained from a subject (e.g., a cancer patient), along with matching PBMCs (e.g., obtained via apheresis). The tumor cells and stromal materials (e.g., stromal cells and other stromal components) obtained from the FNA are introduced into a first immune modulating chamber and are incubated for 24 hours at 37° C. with $CO_2$ in a tissue culture incubator. During collection and/or incubation, adequate media are provided. In addition, the cells and stromal materials are incubated, as appropriate, with pro-inflammatory cytokines (e.g., IL2, IL7, IL12, IL15, IL18, IL21, IFNβ, TNFα, GM-CSF). By limiting these stimulatory cytokines to the confines of the immune modulating chamber, systemic toxic effects associated with high concentrations of these agents can be avoided in a subject. In addition, by co-incubating the tumor-specific leukocytes and tumor cells in the immune modulating chamber, the tumor-specific leukocytes can readily recognize the tumor cells without having to "infiltrate" a stromal layer. Furthermore, available immune-oncology agents, as appropriate, are added to the immune modulating chamber to enhance specific immune activation. Appropriate immune-oncology agents include, but are not limited to, immune checkpoint inhibitors (e.g., anti-CTLA4, anti-PD1, anti-PDL1, anti-OX40, and anti-CD137 antibodies) and indoleamine 2,3-dioxygenase (IDO) inhibitors. After the 24-hour incubation time, the first immune modulating chamber containing the captured tumor and stromal materials is connected to an ex vivo circulatory network as shown in FIG. 7.

Tissue obtained from the core biopsy is dissociated into individual cells and introduced into a second immune modulating chamber. As one alternative, enzymatic dissociation is used. Gently minced tissue is digested into a single-cell suspension by mild enzymatic treatment with trypsin, papain, elastase, hyaluronidase, collagenase, pronase, deoxyribonuclease, or other appropriate enzyme. As a second alternative, chemical dissociation is used. Gently minced tissue is treated with EDTA, EGTA, or complexes of tetraphenylboron plus potassium ions to sequestrate numerous types of cations (such as $Ca^{2+}$ and $Mg^{2+}$).

Dissociated tumor and stromal cells are cultured in the immune modulating chamber (e.g. on a magnetic plate) with appropriate medium at 37° C. with 2 to 5% $CO_2$. Once the immune modulating chamber is repopulated with tumor/stromal contents, the immune modulating chamber is washed 3× with PBS to remove any unbound debris.

Figure 7:
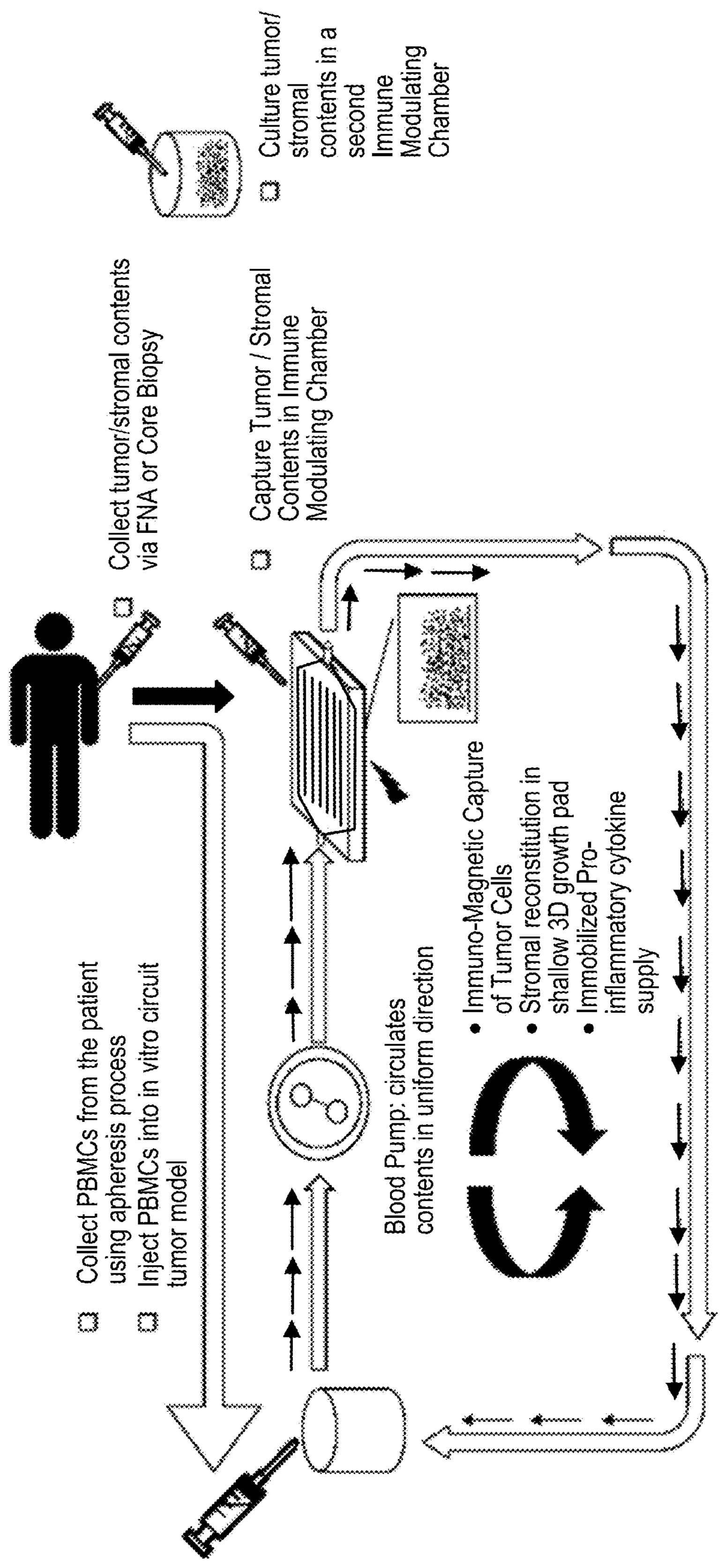
FIG. 7 shows a schematic of the in vitro study described in Example 2. A fine needle aspirate (FNA) sample is obtained from a cancer patient and introduced into a first immune modulating chamber, which is inserted into a circulatory network. A core biopsy is also obtained from the patient, and introduced into a second immune modulating chamber. PBMCs are obtained from the subject and introduced into the circulatory network, where they are passed through the first immune modulating chamber by a circulating pump.

PBMCs collected, for example by apheresis, are injected into the circulatory network, as depicted in FIG. 7. A constant pump is used to circulate the content. Alternating circulating pump velocities are used. As one example, cyclic alteration comprises 1 minute at 10 cm/second, followed by 5 minutes at 0.1 cm/second, followed by 1 minute at 1 cm/second. Any combination of alternating speeds can be used to ensure adequate circulation and sufficient PBMC-tumor cell interaction. The PBMCs become activated as they are exposed to the contents of the first immune modulating chamber.

Figure 8:
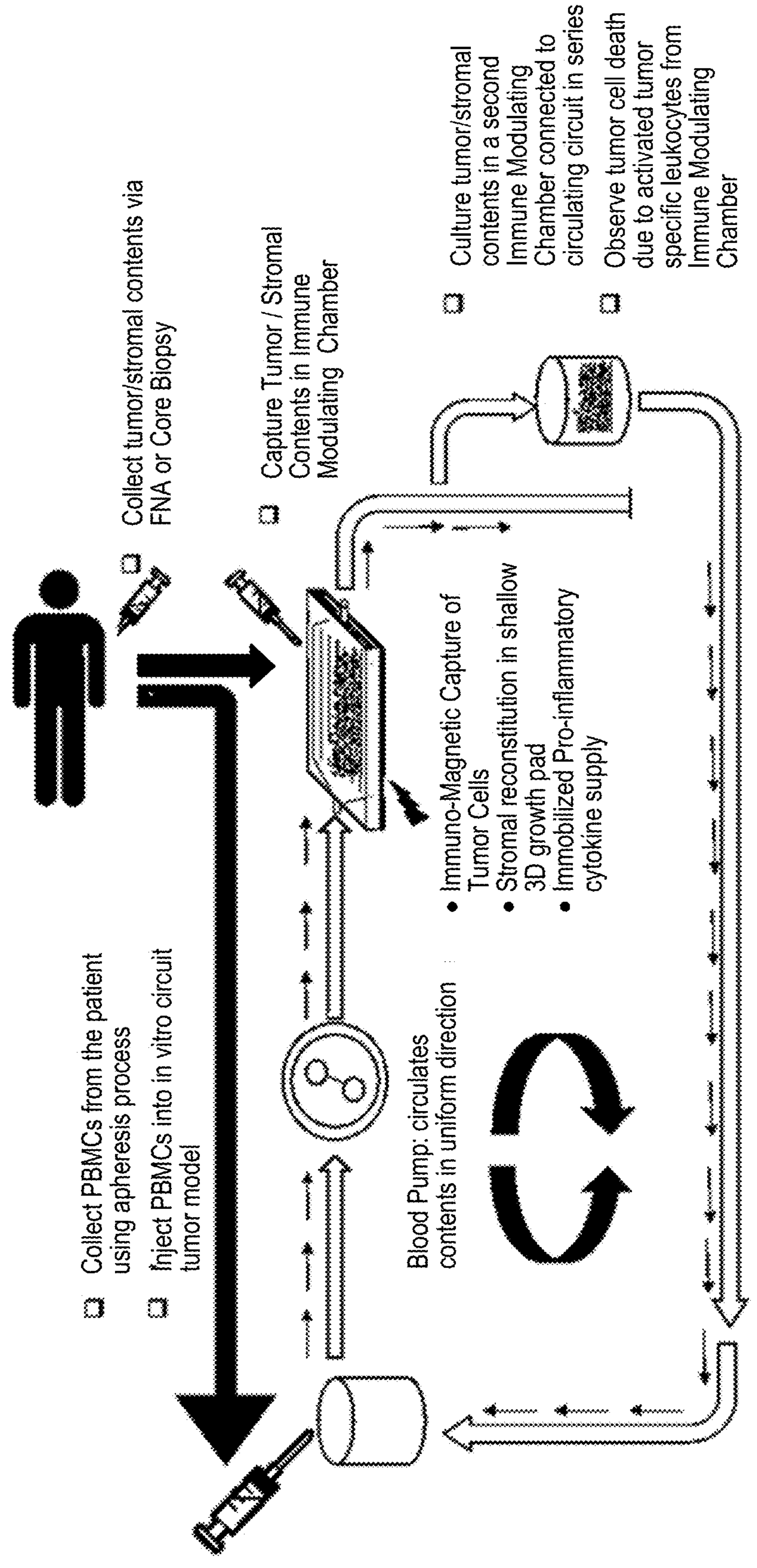
FIG. 8 shows a schematic of a later stage of the in vitro study described in Example 2. Once the tumor cell colony in the second immune modulating chamber has reached an appropriate size, the second immune modulating chamber is connected to the circulatory network Immune cells that have become activated by passing through the first immune modulating chamber are exposed to the tumor cell colony in the second immune modulating chamber, and the effects of these activated immune cells on the tumor cell colony are monitored.

When the tumor/stromal colony is established in the second immune modulating chamber, the second chamber is placed into the circulatory circuit module as shown in FIG. 8. The tumor/stromal colony in the second immune modulating chamber is then monitored for response to activated immune cells.

Example 3

Autologous Immune Cell Activation In Vitro

Figure 9:
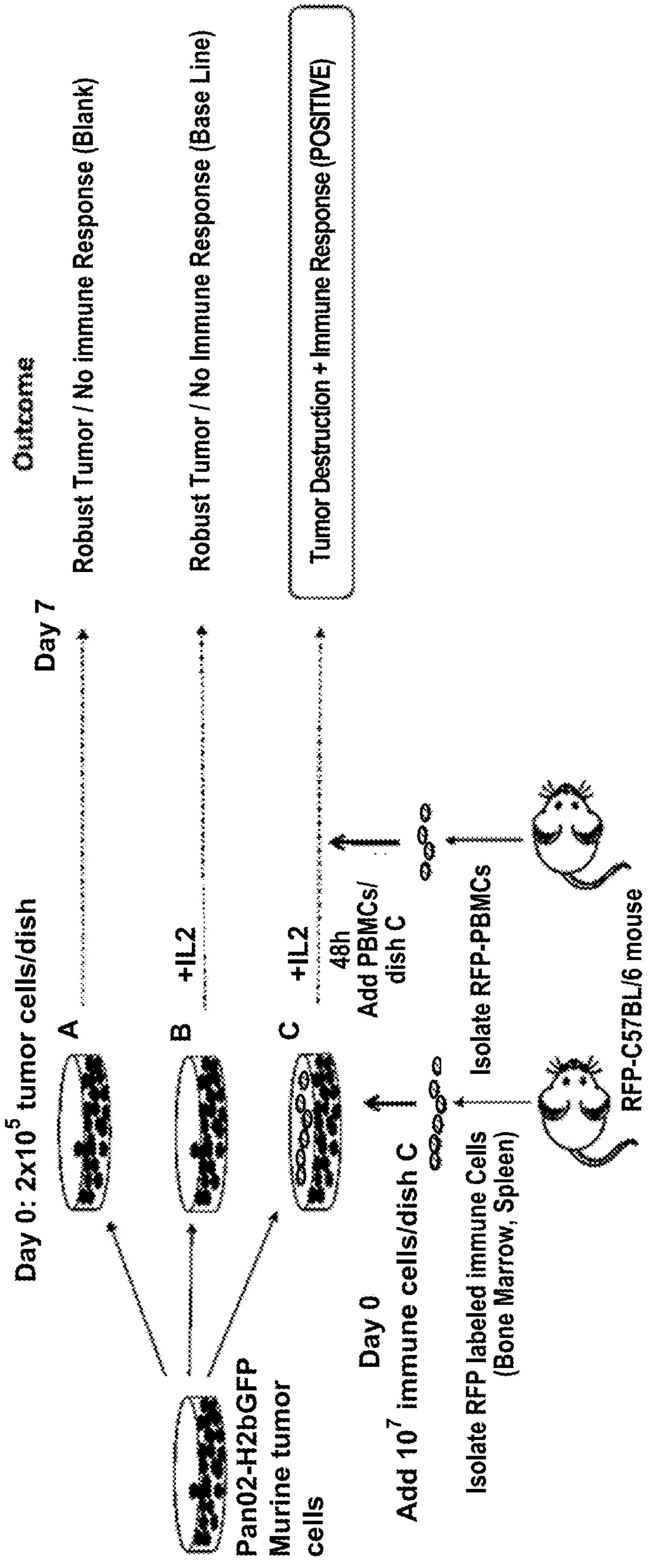
FIG. 9 shows a schematic of the in vitro autologous immune cell activation experiment described in Example 3.

This example describes an in vitro autologous immune cell activation experiment, the setup of which is described in FIG. 9. This experiment utilized differentially labeled, syngeneic murine tumor cells and murine immune cells, namely green fluorescent protein (GFP)-labeled murine tumor pancreatic cells and red fluorescent protein (RFP)-labeled immune cells, respectively. The GFP-labeled pancreatic tumor model was developed using the murine pancreatic adenocarcinoma cell line Pan02 (initially derived from mouse strain C57BL/6 and obtained from the National Cancer Institute's tumor repository, Frederick, Md.) and methods described in the article by Suetsugu et al. (*Anticancer Res.* (2015) 35(5):2553-2557). Briefly, the parental Pan02 cells were transduced with a histone H2B-GFP fusion gene, and stable clones were established. Thus, the resulting cell line, hereafter referred to as Pan02-H2bGFP, exhibited bright nuclear GFP fluorescence due to the fusion gene expression. On day 0, Pan02-H2bGFP cells were seeded at $2\times10^5$ cells per dish onto three separate culture dishes, labeled "A" through "C" and each subsequently cultured in different conditions for seven days, as illustrated in FIG. 9. Dish "A" (tumor cells only) and dish "B" (tumor cells grown in the presence of interleukin 2 (IL-2)) served as negative controls. In contrast, spleen- and bone marrow-derived immune cells freshly extracted from a transgenic RFP labeled C57BL/6 mouse (Jackson Labs, Bar Harbor, Me.) were added to tumor cells in dish "C" on day 0 ($10^7$ RFP-immune cells per dish) and the co-culture was grown in the presence of IL-2 for seven days. After 48 hours, RFP-labeled peripheral blood mononuclear cells (PBMCs) (i.e., freshly extracted from transgenic RFP-C57BL/6 mouse) were introduced into co-culture "C" (i.e., $2.87\times10^5$ PBMCs per dish), and then left for an additional five-day growth period. All cultures were grown in standard cell culture medium supplemented with 10% fetal bovine serum and IL-2 (32 U/mL) when indicated, with no media change over the course of the experiment. Cultures were monitored regularly and cell images were captured with light and fluorescent microscopy.

Figure 10:
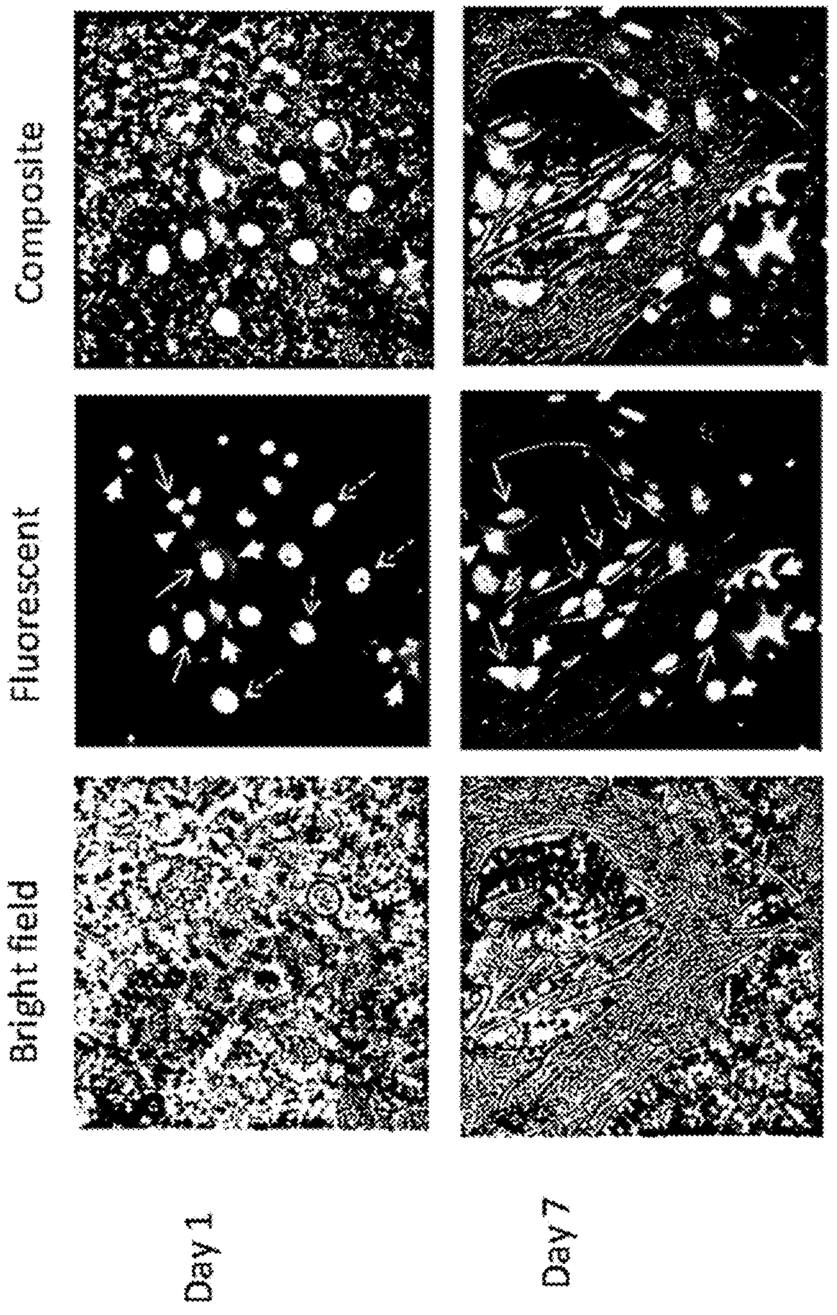
FIG. 10 shows tumor cell and immune cell interactions observed in co-culture grown in the presence of IL-2. Co-culture of Pan02-H2bGFP tumor cells and RFP-immune cells grown with IL-2 was analyzed by light and fluorescent microscopy on day 1 and day 7. Representative bright field, fluorescent and, composite images taken at 600× magnification are shown. Arrowheads point to RFP-expressing immune cells. Solid arrows and dashed arrows point to GFP-labeled tumor cells that were interacting and not interacting with immune cells, respectively Immune cells exhibited pan-cellular RFP expression, whereas tumor cells exhibited nuclear GFP expression.

In the presence of IL-2, immune cell and tumor interactions were visible within 24 hours, as shown in FIG. 10. The interactions between the syngeneic IL-2 stimulated immune cells and tumor cells were observed up to day 7 (see, FIG. 10). Notably, more robust interactions between immune and tumor cells were observed on day 7. This data indicates that the presence of tumor antigens, together with IL-2, was sufficient to rapidly stimulate and activate immune cells in vitro. This demonstrates that autologous anti-tumor immune cell activation using an extracorporeal device containing captured tumor cells (i.e., antigens) can be accomplished in the presence of IL-2.

Figure 11:
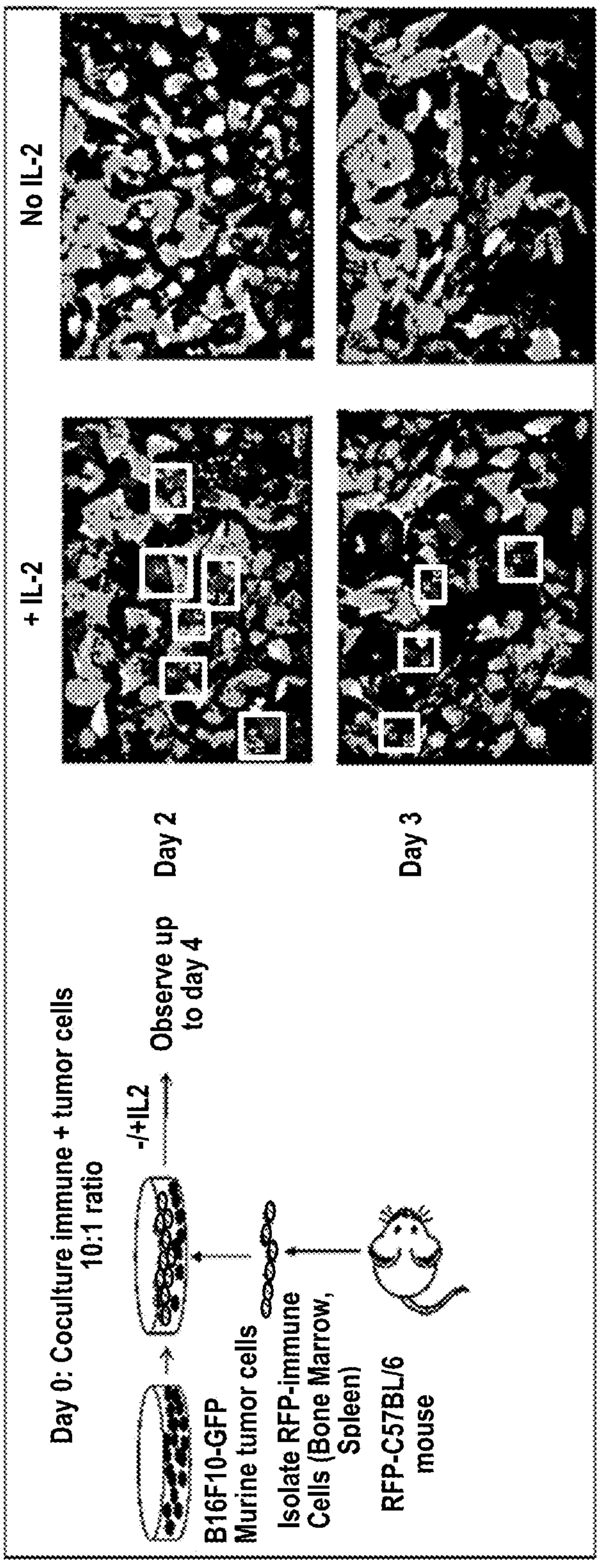
FIG. 11 shows tumor and immune cell co-cultures grown in the presence or absence of IL-2. GFP-labeled murine melanoma cells were co-cultured with syngeneic RFP-immune cells with or without IL-2, as illustrated in the left panel. Co-cultures were observed up to day 4 and analyzed by fluorescent microscopy. Representative fluorescent images obtained on day 2 and day 3 are shown. Boxes surround interactions between RFP-expressing immune cells (IC) and GFP-expressing tumor cells (TC). Both immune cells and tumor cells exhibited pan-cellular expression of RFP and GFP, respectively.

In a similar experiment, GFP-labeled murine melanoma cells derived from B16F10 cells (as described in Tsai et al. *Anticancer Res.* (2010) 30(9):3291-3294) were co-cultured with syngeneic RFP-immune cells extracted from RFP-C57BL/6 mouse (Jackson Labs, Bar Harbor, Me.) with or without IL-2, as illustrated in FIG. 11. Co-cultures were observed up to day 4 and analyzed by fluorescent microscopy. Numerous extensive interactions between RFP-expressing immune cells and GFP-tumor cells were observed on days 2 and 3 when cells were grown with IL-2. In contrast, these interactions were not visible when co-culture was grown without IL-2 (FIG. 11). These results indicate that the presence of IL-2 was crucial to trigger immune cells into recognizing their targets (i.e., tumor antigens) and highlight the importance of cytokine priming in the presence of tumor antigens for effective autologous anti-tumor immune cell activation in the context of an extracorporeal device. Relatedly, this example highlights particular advantages of the present invention—activating immune cells in an immune modulating chamber not only increases exposure of immune cells to tumor cells, but also allows stimulation of immune cells (e.g., with IL-2) to be done in such a way that a subject (e.g., a cancer patient) is not systemically exposed to the stimulating agents, thus minimizing unwanted side effects.

Example 4

Extracorporeal Device for Immune Cell Activation

Figure 12:
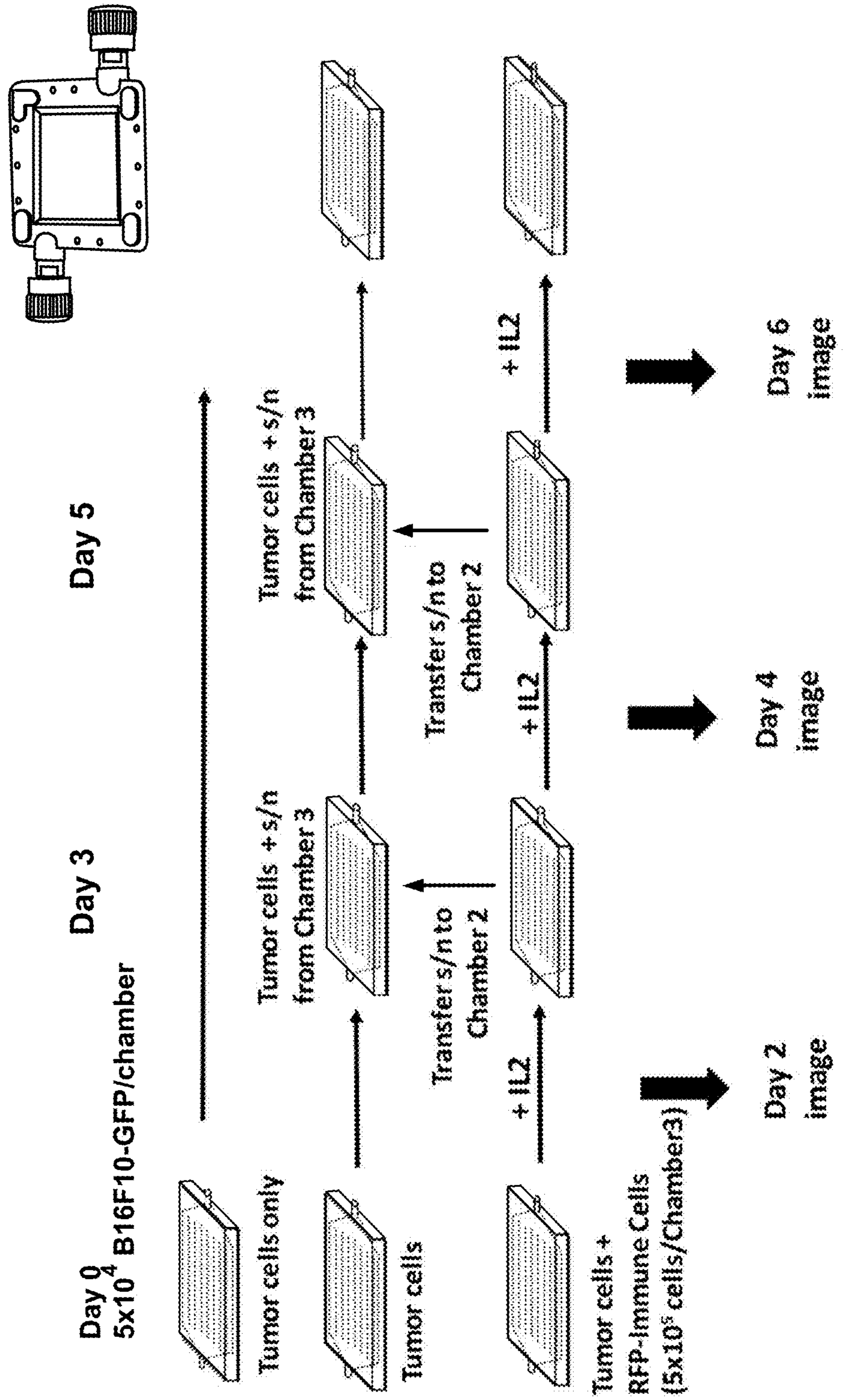
FIG. 12 shows a schematic of the extracorporeal immune cell activation experiment described in Example 4. A VITVO® tissue culture device is shown in the upper right corner.

In the experiment described in this example, GFP-labeled murine melanoma cells derived from B16F10 cells (as described in Tsai et al. *Anticancer Res.* (2010) 30(9):3291-3294) were cultured in special tissue culture devices that allow 3D cell growth within an embedded matrix (VITVO® device, Rigenerand, Italy). These specialized culture vessels were used as extracorporeal immune modulating chambers. In this experiment, as illustrated in FIG. 12 and as described further below, three immune modulating chambers ("chambers") were used and seeded with B16F10-GFP cells on day 0.

Chamber 1 was the control chamber and contained tumor cells only. On day 3 and day 5, fresh medium was added to this chamber.

Chamber 2 was the test chamber. This chamber was initially seeded with tumor cells. On day 3 and day 5, the supernatant (s/n) from the training chamber (i.e., Chamber 3), which was a tumor-immune cell co-culture in the presence of IL-2, was transferred to Chamber 2. On day 3, half of the Chamber 3 supernatant collected was added to fresh medium (1:1) and then transferred to Chamber 2. On day 5, all of the supernatant from Chamber 3 was collected and directly transferred to Chamber 2. For supernatant transfers, supernatant was collected and spun to isolate cellular contents and complete removal of IL-2 (i.e., to minimize carryover of IL-2 from Chamber 3), then the isolated cellular contents were transferred to Chamber 2. The ability of the stimulated immune cells to make their own stimulatory cytokine in an autocrine fashion enabled activated immune cells to recognize tumor cells in a separate environment and initiate an anti-tumor immune response. The purpose of Chamber 2 was to serve as an in vitro model of a subject (e.g., a cancer patient) who is to be treated for cancer according to methods of the present invention.

Chamber 3 was the training chamber. This chamber contained a tumor-immune cell co-culture grown in the presence of IL-2 from day 0. Tumor cells were B16F10-GFP murine melanoma cells and syngeneic RFP-immune cells (bone marrow and spleen) were extracted from RFP-C57BL/6 mouse (Jackson Labs, Bar Harbor, ME). On day 3, the supernatant from Chamber 3 was collected and split 1:2. One half was reconstituted with fresh medium (1:1) without IL-2 and added to Chamber 2, while the other half was reconstituted with fresh medium (1:1) with IL-2 and added back to Chamber 3. On day 5, all the supernatant from Chamber 3 was collected and directly transferred to Chamber 2 and fresh medium supplemented with IL-2 was added to Chamber 3. As mentioned above, for supernatant transfers, supernatant was spun to isolate cellular contents and remove IL-2, and the isolated cellular contents were then transferred to Chamber 2.

Figure 13:
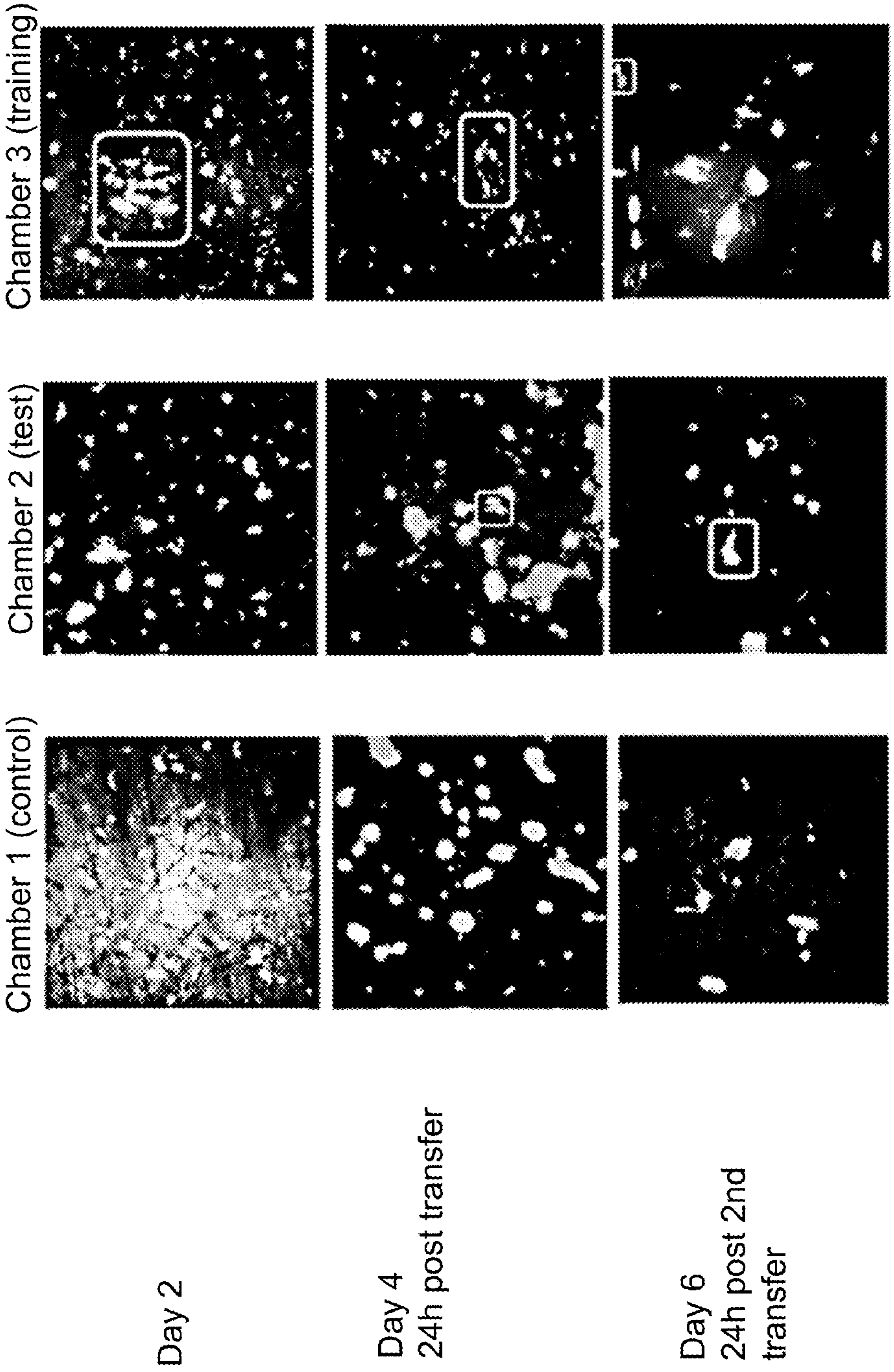
FIG. 13 shows representative fluorescent images of immune modulating chamber cultures taken at 200× magnification. Both immune and tumor cells exhibited pan-cellular expression of RFP and GFP, respectively. Boxes highlight immune and tumor cell interactions.

Fluorescent images to monitor immune and tumor cell interactions were taken at different time points, as shown in FIG. 12. Representative fluorescent images of immune modulating chamber cultures show that immune and tumor cell interactions in the training chamber (Chamber 3) were visible by day 2 (see, FIG. 13). Strikingly, on day 4, as soon as 24 hours after the first transfer from the training chamber to the test chamber, immune and tumor cell interactions were visible in the test chamber. These immune and tumor cell interactions remained visible up to day 6 (FIG. 13). These results indicate that autologous immune cells, stimulated and activated to recognize tumor cells in an extracorporeal device, were able to recognize their targets (i.e., tumor antigens) when transferred to a different extracorporeal device. Furthermore, this example mimics a pseudo-metastatic tumor region model of activated anti-tumor immune cells circulating to distant metastatic sites.

Example 5

In Vivo Animal Model for Extracorporeal Autologous Immune Cell Therapy

Figure 14:
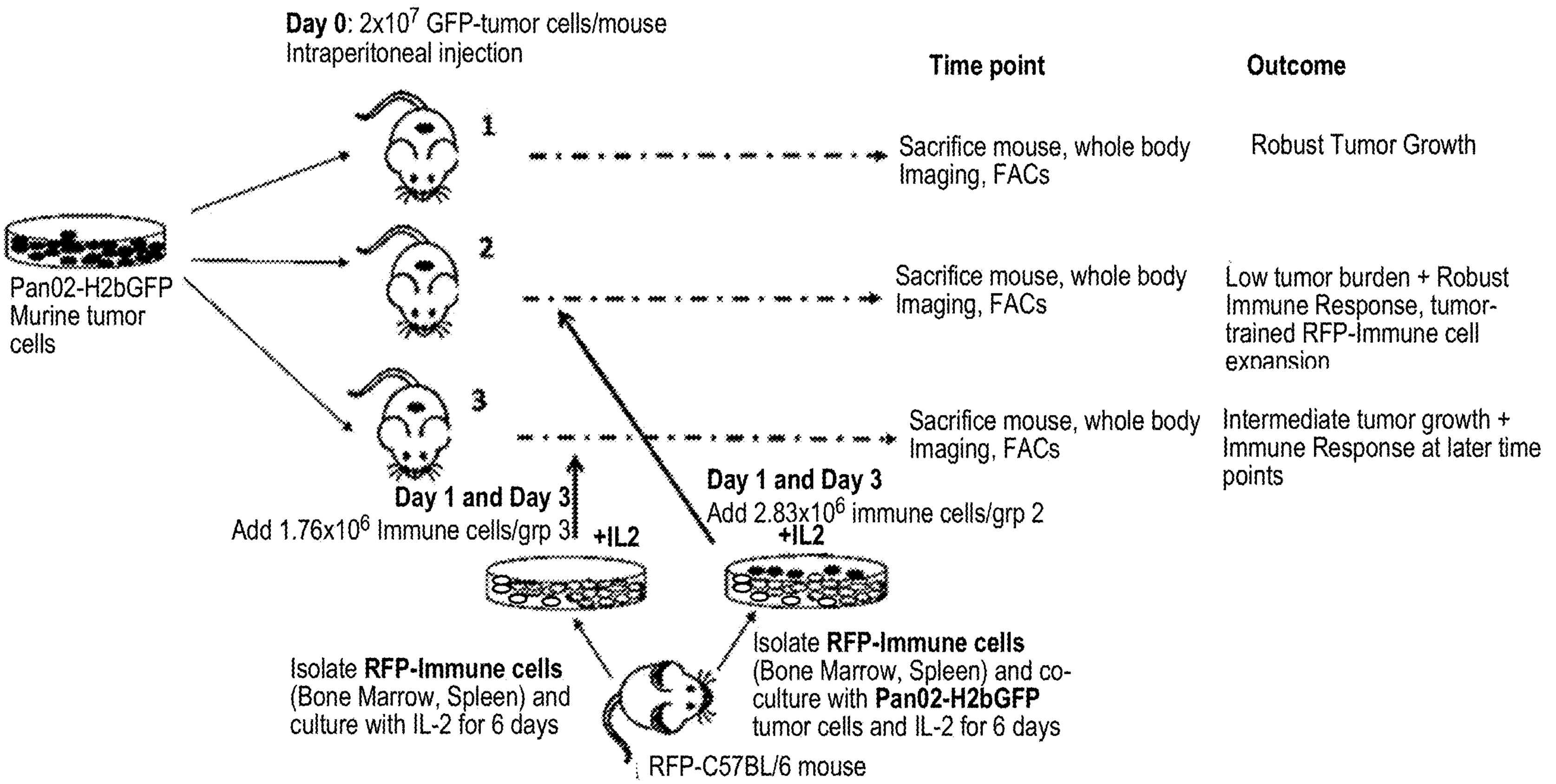
FIG. 14 shows a schematic of the in vivo model for autologous immune cell therapy described in Example 5.

The experiment described in this example is summarized in FIG. 14 and utilizes the same differentially labeled, syngeneic murine tumor cells and murine immune cells as described above in Example 3, namely Pan02-H2bGFP cells and RFP-labeled immune cells extracted from transgenic RFP-C57BL/6 mice (Jackson Labs, Bar Harbor, ME). In this experiment, standard C57BL/6 mice received an intraperitoneal injection of Pan02-H2bGFP cells on day 0 ($2\times10^7$ cells/mouse) in order to generate a disseminated pancreatic tumor model in their peritoneal cavities. The mice were then divided into three groups, as illustrated in FIG. 14 and described further below.

Group 1 was the control group. These mice did not receive any injections of RFP-labeled immune cells over the course of the experiment and relied solely upon their host immune systems to block the growth of the GFP-labeled pancreatic tumor cells.

Group 2 was the test group. These mice received two separate injections, on day 1 and day 3, of spleen- and bone marrow-derived RFP-immune cells which had been co-cultured for 6 days with Pan02-H2bGFP cells in the presence of IL-2 ($2.83\times10^6$ RFP-immune cells/mouse). In other words, these mice were injected with stimulated and tumor-trained RFP-immune cells.

Group 3 was the baseline group. These mice received two separate injections, on day 1 and day 3, of spleen- and bone marrow-derived RFP-immune cells which had been cultured for 6 days in the presence of IL-2 but without any Pan02-H2bGFP tumor cells ($1.76\times10^6$ RFP-immune cells/mouse). In other words, these mice were injected with stimulated and untrained RFP-immune cells.

This experiment was designed to test the hypothesis that autologous immune cells, stimulated and tumor-trained in vitro in an extracorporeal device, are able to exert anti-tumor activity when transferred to a living organism harboring the same tumor type that the immune cells were trained against. It was anticipated that the most robust tumor growth would occur in the control group. In contrast, it was expected that a reduced tumor burden would be observed in the test group and intermediate tumor growth would be observed in the baseline group.

Figure 15:
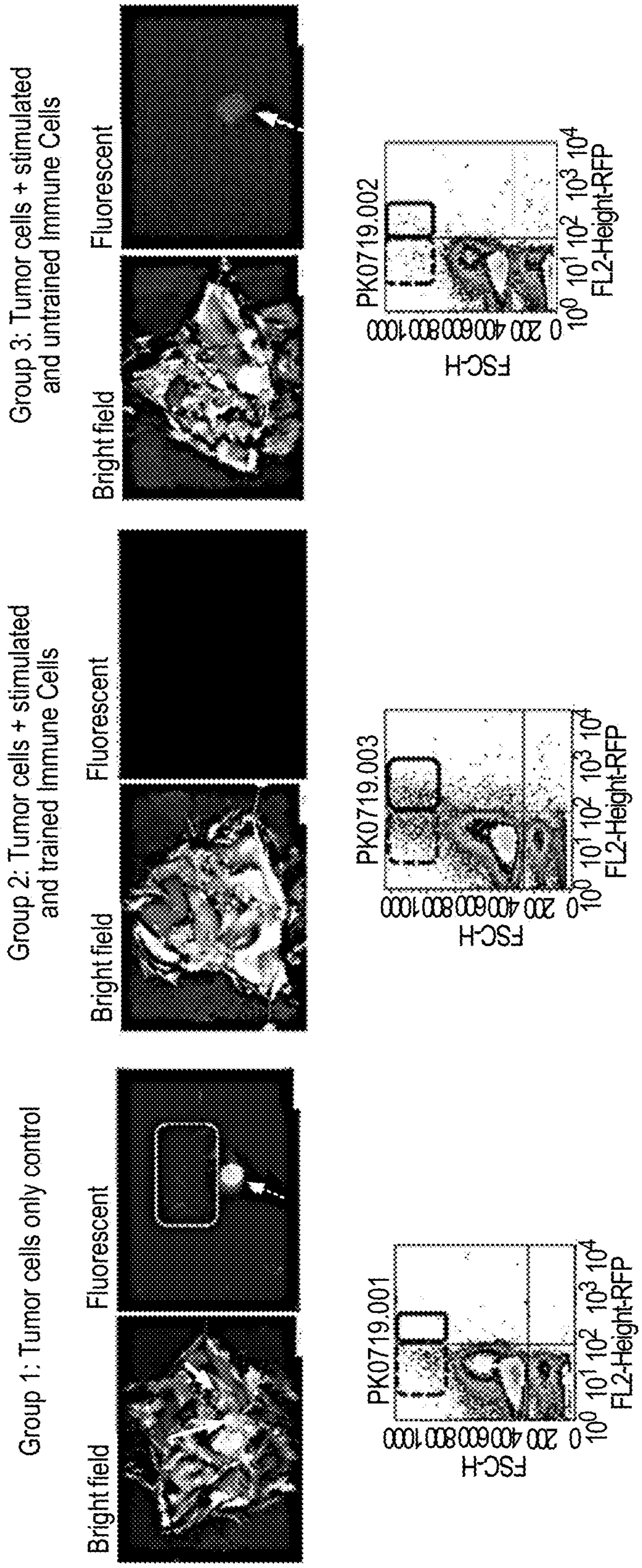
FIG. 15 shows whole body imaging (upper panels) and cytometric analysis of PBMCs isolated from peripheral blood (lower panels) of animals sacrificed on day 6 (one mouse from each experimental group was sacrificed). Cytometry data shows RFP fluorescence (x-axis) in relation to forward scatter (y-axis). RFP-positive and RFP-negative immune cell populations are encircled by full and dashed lines, respectively. For Group 1, arrows point to visible tumors that were present in the peritoneal cavity of the mouse harboring GFP-pancreatic tumor model. Fluorescent tumor cells and/or tumor cell debris were visible in the bladder (dashed arrow) and throughout the visceral space along the intestinal lining (encircled by dashed line). For Group 2, no visible tumors were present in the peritoneal cavity of the mouse that was injected with Pan02-H2bGFP cells. Furthermore, no evidence of GFP-tumor cells was observed with fluorescent scanning. For Group 3, the arrow points to a visible tumor that was present in the peritoneal cavity of the mouse harboring GFP-pancreatic tumor model. Fluorescent tumor cells and/or tumor cell debris were visible in the bladder (dashed arrow); however the GFP fluorescence was weaker than in the control mouse.

At specific time points, one mouse per group was sacrificed and bright field images along with fluorescent images of the body cavity were captured to determine the extent of GFP-tumor growth. In addition, PBMCs from peripheral blood were harvested and analyzed by cytometry. FIG. 15 shows the results obtained for one animal of each group sacrificed on day 6 of this experiment. Visible tumors were present in the peritoneal cavities of the control and Group 3 mice, while none were observed in the peritoneal cavity of the Group 2 test mouse (comparison of bright field whole body images, FIG. 15). Furthermore, GFP-expressing tumor cells and/or GFP-tumor cell debris were visible in the bladder and throughout the visceral space along the intestinal lining of the control mouse. However, no RFP-expressing immune cells were observed, as expected, since these mice were not injected with immune cells. Fluorescent tumor cells and/or tumor cell debris were also visible in the bladder of the Group 3 mouse, but the fluorescence intensity was overall weaker than in the control mouse. In contrast, no evidence of GFP-pancreatic tumor cells was found with fluorescent imaging of the test mouse from Group 2 (see, FIG. 15). As anticipated, the most robust tumor growth was present in the control mouse, while the test mouse showed a lack of visible tumor growth and/or fluorescent tumor cells. These results demonstrate that an effective anti-tumor immune response took place in the test mouse, most likely carried out by the extracorporeally stimulated and anti-tumor trained RFP-immune cells that were injected into the peritoneal cavities of mice in this test group. Indeed, cytometric analysis of PBMCs collected from peripheral blood of test mouse 2 showed the existence of a large population of circulating RFP-immune cells (see, FIG. 15). This data demonstrates that the activated anti-tumor trained RFP-immune cells that were injected into this animal expanded in vivo and went into circulation. Furthermore, a substantial RFP-negative immune cell population was evidenced by cytometric analysis of blood from test mouse 2 (FIG. 15). This demonstrates that the anti-tumor immune response initiated by the extracorporeally trained RFP-immune cells subsequently triggered an immune response by the host immune cells, resulting in the expansion of host (i.e., unlabeled) anti-tumor immune cells. Data collected from blood of the mouse in Group 3 showed some evidence of circulating RFP-immune cells as well as some unlabeled immune cells (FIG. 15). However, both of these populations were small, indicating that in this animal, which did not mount a robust anti-tumor immune response by day 6, neither the untrained RFP immune cells nor the host immune cells were expanded in vivo. As expected, there was no evidence of circulating RFP-immune cells in blood collected from the control mouse.

Figure 16A:
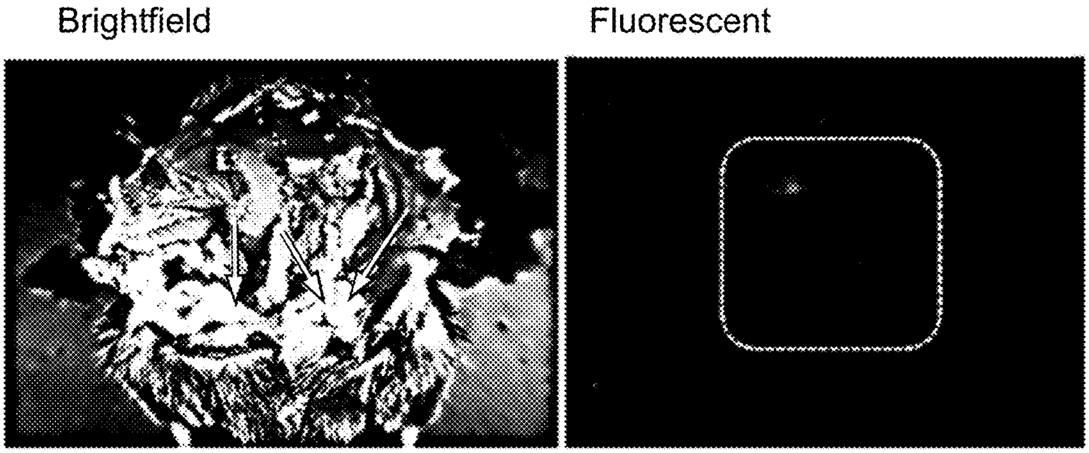
FIGS. 16A-16G show whole body imaging and cytometry analysis of tissues and PBMCs isolated from peripheral blood of animals sacrificed on day 17.
Figure 16B:
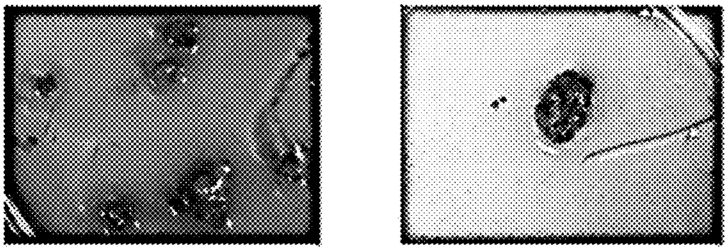
Figure 16C:
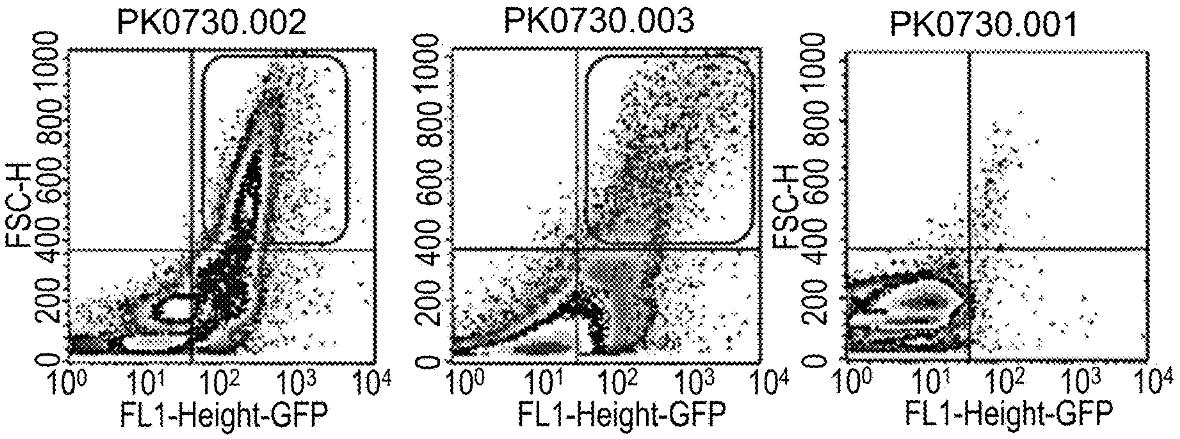
Figure 16D:
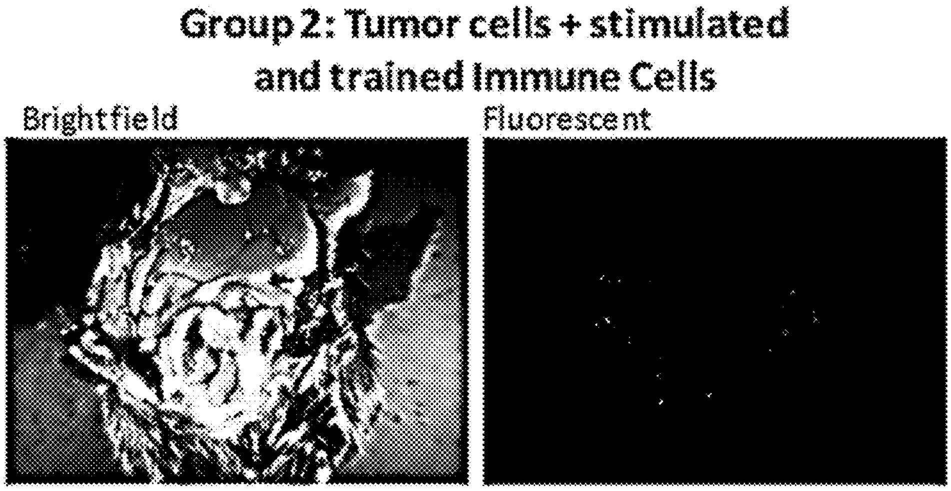
Figure 16E:
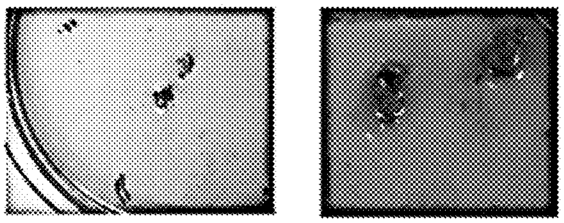
Figure 16F:
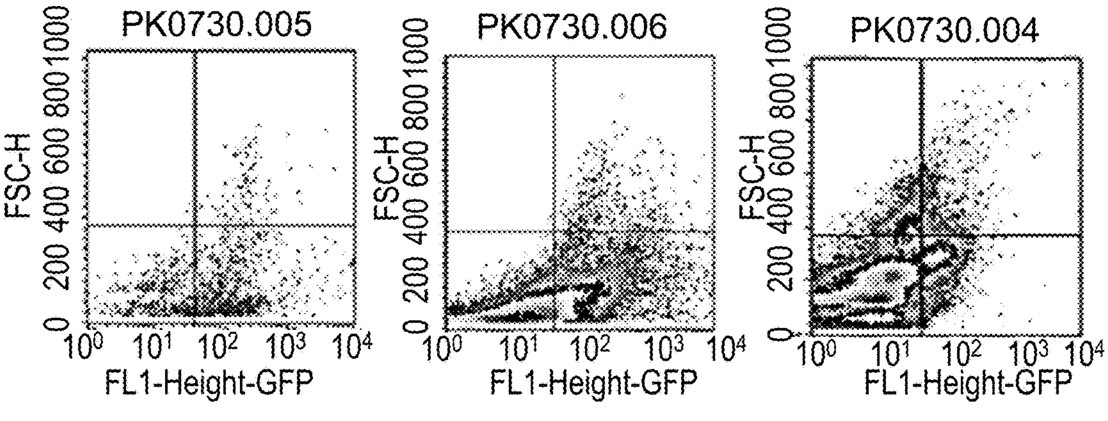
Figure 16G:
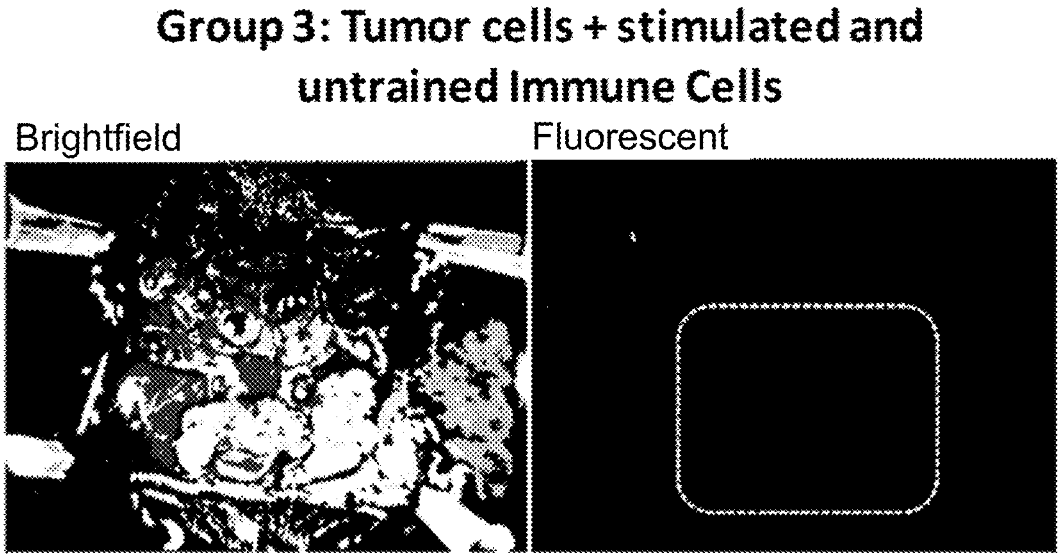

Furthermore, as shown in FIG. 16, on day 17 visible tumor was evident in the tumor-only mouse (Group 1) (FIGS. 16A-16C) while no apparent tumor was found in the mouse injected with trained immune cells (Group 2) (FIGS. 16D-16F). Cytometry data showed the presence of GFP-positive tumor cells in a suspicious tumor nodule and omentum from the tumor-only mouse (Group 1) (solid boxes in left and middle panels of FIG. 16C, which shows GFP fluorescence (x-axis) in relation to forward scatter (y-axis)) while no RFP-positive immune cells were detected in PBMCs (right panel of FIG. 16C). On the other hand, cytometry analysis revealed no evidence of GFP-positive tumor cells in a suspicious tumor nodule or omentum from the experimental mouse (Group 2) (left and middle panels of FIG. 16F) while RFP positive immune cells were detected in PBMCs (right panel of FIG. 16F).

Overall, these results demonstrate that immune cells, when initially stimulated and anti-tumor trained in an extracorporeal device and then transferred to a living organism harboring a tumor, are able to induce an anti-tumor immune response in that organism. This response involves the aforementioned stimulated and anti-tumor trained immune cells, as well as host immune cells. This data also highlights the importance of stimulating and training the immune cells in the extracorporeal device prior to transfer in order to trigger a robust anti-tumor immune response.

It is understood that the examples and embodiments described herein are for illustrative purposes only and that various modifications or changes in light thereof will be suggested to persons skilled in the art and are to be included within the spirit and purview of this application and scope of the appended claims. All publications, patents, patent applications, and sequence accession numbers cited herein are hereby incorporated by reference in their entirety for all purposes.

What is claimed is:

1. A method for activating an immune cell in a subject, the method comprising:

(a) passing an immune cell from the subject through an immune modulating chamber, wherein the immune modulating chamber comprises a solid support and (i) a tumor cell, (ii) a pro-immunogenic factor, and (iii) a stromal component that are restrained on the solid support within the immune modulating chamber, thereby exposing the immune cell to the tumor cell, the pro-immunogenic factor, and the stromal component and activating the immune cell, and wherein the immune modulating chamber comprises an inlet port and/or an outlet port in fluid communication with the subject's vascular system, peritoneal cavity, pleural cavity, or cerebrospinal fluid (CSF); and (b) returning the activated immune cell to the subject.

2. The method of claim 1, wherein the method is performed ex vivo.

3. The method of claim 1, wherein the method increases an autologous immune response in the subject.

4. The method of claim 1, wherein the method reduces or eliminates an adverse effect of a systemic therapy in the subject.

5. The method of claim 1, wherein the immune cell is a leukocyte or peripheral blood mononuclear cell (PBMC).

6. The method of claim 1, wherein the immune cell is contained within a whole blood sample that is obtained from the subject.

7. The method of claim 6, wherein the whole blood sample is passed through the immune modulating chamber.

8. The method of claim 6, wherein an immune cell-containing portion is isolated from the whole blood sample, and the immune cell-containing portion of the whole blood sample is passed through the immune modulating chamber.

9. The method of claim 8, wherein the immune cell-containing portion of the whole blood sample is isolated using a filtration method.

10. The method of claim 8, wherein the immune cell-containing portion of the whole blood sample is isolated using apheresis.

11. The method of claim 8, wherein the immune cell-containing portion of the whole blood sample is isolated by passing the whole blood sample through an isolation device that is in fluid communication with the immune modulating chamber.

12. The method of claim 8, wherein an immune inhibition factor and/or a factor that has an adverse effect on the subject are removed from the immune cell-containing portion and/or a non-immune cell-containing portion of the whole blood sample before the immune cell-containing portion and/or the non-immune cell-containing portion of the whole blood sample are returned to the subject.

13. The method of claim 1, wherein the inlet and/or outlet port are in fluid communication with the subject's venous system.

14. The method of claim 1, wherein the inlet and/or outlet port are in fluid communication with the subject's arterial system.

15. The method of claim 1, wherein the tumor cell is a circulating tumor cell (CTC).

16. The method of claim 1, wherein the tumor cell comprises a plurality of tumor cells.

17. The method of claim 1, wherein the tumor cell is obtained from a biopsy, a fine needle aspirate (FNA), a surgical resection, a blood sample, a pleural effusion sample, a peritoneal effusion sample, a CSF sample, or a combination thereof.

18. The method of claim 1, wherein the tumor cell comprises an autologous tumor cell.

19. The method of claim 1, wherein the tumor cell comprises an allogeneic tumor cell.

20. The method of claim 1, wherein the tumor cell is introduced into the immune modulating chamber before the immune cell is passed through the immune modulating chamber.

21. The method of claim 1, wherein the tumor cell is introduced into the immune modulating chamber concurrently with the immune cell.

22. The method of claim 21, wherein the tumor cell is contained within a whole blood sample or immune cell-containing portion thereof, and becomes restrained on the solid support within the immune modulating chamber as the blood sample or immune cell-containing portion thereof passes through the immune modulating chamber.

23. The method of claim 1, wherein the tumor cell is restrained on the solid support by a capture moiety.

24. The method of method of claim 23, wherein the capture moiety also promotes tumor cell proliferation.

25. The method of claim 23, wherein the capture moiety is selected from the group consisting of an antibody, a cell adhesion molecule, and a combination thereof.

26. The method of claim 25, wherein the antibody is an antibody that binds to epithelial cell adhesion molecule (EpCAM), alpha-fetoprotein (AFP), carcinoembryonic antigen (CEA), cancer antigen 125 (CA-125), MUC1, CD44, HER2, HER3, FGFR1, FGFR2, FGFR3, FGFR4, IGF1R, c-Met, EGFR, PD-L1, or a combination thereof.

27. The method of claim 25, wherein the cell adhesion molecule is selected from the group consisting of a selectin, an integrin, vascular cell adhesion molecule 1 (VCAM1), and a combination thereof.

28. The method of claim 27, wherein the selectin is selected from the group consisting of E-selectin, L-selectin, and a combination thereof.

29. The method of claim 1, wherein the immune modulating chamber further comprises an anti-immune inhibition factor.

30. The method of claim 1, wherein the pro-immunogenic factor is selected from the group consisting of interleukin 2 (IL-2), interleukin 4 (IL-4), interleukin 5 (IL-5), interleukin 6 (IL-6), interleukin-7 (IL-7), interleukin-12 (IL-12), interleukin-15 (IL-15), interleukin 17 (IL-17), interleukin-18 (IL-18), interleukin 22 (IL-22), C—X—C chemokine receptor type 3 (CXCR3), interferon beta (IFNβ), interferon gamma (IFNγ), tumor necrosis factor alpha (TNFα), granulocyte-macrophage colony-stimulating factor (GM-CSF), and a combination thereof.

31. The method of claim 1, wherein the pro-immunogenic factor is IL-2.

32. The method of claim 29, wherein the anti-immune inhibition factor is selected from the group consisting of an immune checkpoint inhibitor, an indoleamine 2,3-dioxygenase (IDO) inhibitor, and a combination thereof.

33. The method of claim 32, wherein the immune checkpoint inhibitor inhibits programmed cell death 1 ligand 1 (PDL1), programmed cell death protein 1 (PD1), cytotoxic T lymphocyte associated protein 4 (CTLA4), T cell immunoglobulin 3 (TIM3), lymphocyte activation gene 3 (LAG3), V-domain Ig suppressor of T cell activation (VISTA), B and T lymphocyte attenuator (BTLA), or a combination thereof.

34. The method of claim 1, wherein the immune modulating chamber further comprises a subject-specific mutated peptide.

35. The method of claim 34, wherein the subject-specific mutated peptide is selected from the group consisting of EGFRvIII peptide, p95HER2 peptide, an EGFR peptide comprising an activating mutation, and a combination thereof.

36. The method of claim 23, wherein the capture moiety is attached to the solid support.

37. The method of claim 1, wherein the solid support comprises an interior surface of the immune modulating chamber or a support structure that is in contact with an interior surface of the immune modulating chamber, and optionally further comprises a magnetic composition.

38. The method of claim 37, wherein the support structure comprises a matrix.

39. The method of claim 36, wherein the capture moiety is covalently attached to the solid support.

40. The method of claim 36, wherein the capture moiety is magnetically attached to the solid support.

41. The method of claim 40, wherein the capture moiety; comprises a magnetic particle.

42. The method of claim 40, wherein the solid support comprises a magnetic composition and wherein the capture moiety is magnetically attached to the magnetic composition.

43. The method of claim 40, wherein an electromagnetic field that is external to the immune modulating chamber is used to magnetically attach the capture moiety to the solid support.

44. The method of claim 1, wherein the tumor cell is induced to undergo apoptosis by exposure to an oncolytic virus, radiation, and/or a chemotherapeutic agent.

45. The method of claim 1, wherein the subject is administered a chimeric antigen receptor T-cell.

46. The method of claim 1, wherein the immune modulating chamber further comprises a flow regulator and/or a pump.

47. The method of claim 46, wherein the flow regulator and/or the pump are used to adjust the rate at which the immune cell passes through the immune modulating chamber.

48. The method of claim 46, wherein the availability of oxygen inside the immune modulating chamber is controlled by using the flow regulator and/or the pump to adjust the flow rate of whole blood through the immune modulating chamber and/or by adjusting the number or density of red blood cells passing through the immune modulating chamber.

49. The method of claim 1, wherein multiple immune modulating chambers are used.

50. The method of claim 49, wherein the multiple immune modulating chambers are each in fluid communication with each other.

51. The method of claim 49, wherein each of the multiple immune modulating chambers comprises a different tumor cell.

52. The method of claim 1, wherein the tumor cell is removed from the immune modulating chamber after the immune cell has passed through the immune modulating chamber, and the presence or level of one or more biomarkers in the tumor cell is detected.

53. The method of claim 52, wherein the presence or level of the one or more biomarkers is used to provide a diagnosis to the subject and/or select a treatment for a disease in the subject.

54. A method for treating cancer in a subject, the method comprising activating an immune cell and returning the activated immune cell to the subject according to the method of claim 1.

55. The method of claim 54, wherein the cancer comprises a solid tumor.

56. The method of claim 54, wherein the cancer is selected from the group consisting of lung cancer, brain cancer, breast cancer, gastric cancer, colorectal cancer, prostate cancer, ovarian cancer, melanoma, a sarcoma, and a combination thereof.

57. A method for inducing an immune response against a tumor in a subject, the method comprising activating an immune cell and returning the activated immune cell to the subject according to the method of claim 1.

58. The method of claim 57, wherein the tumor comprises the same type of tumor cell that is restrained on the solid support within the immune modulating chamber.

59. The method of claim 57, wherein the tumor is a solid tumor.

60. The method of claim 57, wherein the tumor is from a cancer selected from the group consisting of lung cancer, brain cancer, breast cancer, gastric cancer, colorectal cancer, prostate cancer, ovarian cancer, melanoma, a sarcoma, and a combination thereof.

* * * * *